United States Patent
Nagao

(10) Patent No.: US 12,046,445 B2
(45) Date of Patent: Jul. 23, 2024

(54) ELECTRON BEAM INSPECTION APPARATUS AND ELECTRON BEAM INSPECTION METHOD

(71) Applicant: NuFlare Technology, Inc., Yokohama (JP)

(72) Inventor: Takuro Nagao, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 372 days.

(21) Appl. No.: 17/625,501

(22) PCT Filed: Jun. 29, 2020

(86) PCT No.: PCT/JP2020/025565
§ 371 (c)(1),
(2) Date: Jan. 7, 2022

(87) PCT Pub. No.: WO2021/024648
PCT Pub. Date: Feb. 11, 2021

(65) Prior Publication Data
US 2022/0270845 A1   Aug. 25, 2022

(30) Foreign Application Priority Data
Aug. 6, 2019   (JP) .................................. 2019-144210

(51) Int. Cl.
*H01J 37/22*   (2006.01)
*G06T 3/40*   (2024.01)
(Continued)

(52) U.S. Cl.
CPC .............. *H01J 37/222* (2013.01); *G06T 3/40* (2013.01); *G06T 7/001* (2013.01); *H01J 37/28* (2013.01);
(Continued)

(58) Field of Classification Search
CPC .... H01J 37/222; H01J 37/28; H01J 2237/221; G06T 3/40; G06T 7/001;
(Continued)

(56) References Cited

U.S. PATENT DOCUMENTS 8,285,031 B2 *  10/2012  Kitamura ............. G06V 10/471
                                                                382/199
2006/0078191 A1 *  4/2006  Matsumura ........ G01N 21/8851
                                                                382/149
(Continued)

FOREIGN PATENT DOCUMENTS

JP   2001-250110 A   9/2001
JP   2008-32742 A    2/2008
(Continued)

OTHER PUBLICATIONS

International Search Report issued on Sep. 24, 2020 in PCT/JP2020/025565 filed on Jun. 29, 2020, 2 pages.

*Primary Examiner* — David E Smith
*Assistant Examiner* — Christopher J Gassen
(74) *Attorney, Agent, or Firm* — Oblon, McClelland, Maier & Neustadt, L.L.P.

(57) ABSTRACT

An electron beam inspection apparatus according to one aspect of the present invention includes an image acquisition mechanism to acquire a secondary electron image by scanning a substrate, on which a figure pattern is formed, with an electron beam, and detecting a secondary electron emitted due to irradiation with the electron beam by the scanning, a resize processing unit to perform, using design pattern data being a basis of the figure pattern, resize processing on the figure pattern to enlarge its size in a scan direction of the electron beam, a first developed image generation unit to generate, using the design pattern data which has not been resized, a first developed image by developing an image of a design pattern of a region corresponding to the secondary
(Continued)

electron image, a second developed image generation unit to generate, using partial patterns enlarged by the resize processing in the figure pattern having been resized, a second developed image by developing an image of partial patterns in a region corresponding to the secondary electron image, a map generation unit to generate a pseudo defect candidate pixel map which can identify a pseudo defect candidate pixel that has no pattern in the first developed image and has a pattern in the second developed image, a reference image generation unit to generate a reference image of the region corresponding to the second electron image, and a comparison unit to compare, using the pseudo defect candidate pixel map, the second electron image with the reference image of the region corresponding to the second electron image.

10 Claims, 14 Drawing Sheets

(51) Int. Cl.
    *G06T 7/00*         (2017.01)
    *H01J 37/28*      (2006.01)

(52) U.S. Cl.
    CPC ............... *G06T 2207/10061* (2013.01); *G06T 2207/30148* (2013.01)

(58) Field of Classification Search
    CPC ........... G06T 2207/10061; G06T 2207/30148; G01N 2223/426; G01N 2223/6116; G01N 2223/6462; G01N 2223/6466; G01N 23/2251; G01N 23/04; G01N 23/18; G01N 2223/079; G01N 2223/302; G01N 2223/33; G01N 2223/401; G01N 2223/646; H01L 22/12; G03F 1/84

See application file for complete search history.

(56) References Cited

U.S. PATENT DOCUMENTS

| | | | |
|---|---|---|---|
| 2007/0071307 A1* | 3/2007 | Isomura | G06T 7/001 382/149 |
| 2013/0322735 A1* | 12/2013 | Tamura | G06T 7/0004 382/144 |
| 2014/0043467 A1* | 2/2014 | Yamashita | G06T 7/0004 348/125 |
| 2014/0307945 A1* | 10/2014 | Yasui | G06T 7/60 382/149 |
| 2015/0212019 A1 | 7/2015 | Shishido et al. | |
| 2016/0336147 A1 | 11/2016 | Platzgummer | |
| 2018/0350057 A1* | 12/2018 | Inoue | G03F 1/84 |

FOREIGN PATENT DOCUMENTS

| | | | |
|---|---|---|---|
| JP | 2013-246062 A | | 12/2013 |
| JP | 2017-162590 A | | 9/2017 |
| JP | 2018028636 A | * | 2/2018 |

* cited by examiner

ELECTRON BEAM INSPECTION APPARATUS AND ELECTRON BEAM INSPECTION METHOD

TECHNICAL FIELD

This application is based upon and claims the benefit of priority from Japanese Patent Application No. 2019-144210 filed on Aug. 6, 2019 in Japan, the contents of which are incorporated herein.

The present invention relates to an electron beam inspection apparatus and an electron beam inspection method. For example, it relates to an inspection apparatus employing electron multiple beams, and a method therefor.

BACKGROUND ART

With recent progress in high integration and large capacity of the Large Scale Integrated circuits (LSI), the circuit line width required for semiconductor elements is becoming increasingly narrower. Since LSI manufacturing requires an enormous production cost, it is essential to improve the yield. However, as typified by 1 gigabit DRAMs (Random Access Memories), patterns which make up LSI are reduced from the order of submicrons to nanometers. Also, in recent years, with miniaturization of dimensions of LSI patterns formed on a semiconductor wafer, dimensions to be detected as a pattern defect have become extremely small. Therefore, the pattern inspection apparatus for inspecting defects of ultrafine patterns exposed/transferred onto a semiconductor wafer needs to be highly accurate.

As an inspection method, there is known a method of comparing a measured image acquired by imaging a pattern formed on a substrate, such as a semiconductor wafer or a lithography mask, with design data or with another measured image acquired by imaging the identical pattern on the substrate. For example, as a pattern inspection method, there are "die-to-die inspection" and "die-to-database inspection". The "die-to-die inspection" method compares data of measured images acquired by imaging identical patterns at different positions on the same substrate. The "die-to-database inspection" method generates, based on pattern design data, design image data (reference image), and compares it with a measured image being measured data acquired by imaging a pattern. Acquired images are transmitted as measured data to a comparison circuit. After performing alignment between the images, the comparison circuit compares the measured data with reference data according to an appropriate algorithm, and determines that there is a pattern defect if the compared data do not match each other.

In defect inspection of semiconductor wafers and photomasks, it is required to detect smaller size defects. Therefore, with respect to recent inspection apparatuses, specifically the pattern inspection apparatus described above, in addition to the type of apparatus that irradiates an inspection substrate with laser beams to obtain a transmission image or a reflection image of a pattern formed on the substrate, there has been developed another type of inspection apparatus that acquires a pattern image by scanning the inspection substrate with electron beams whose wavelength is shorter than that of laser lights, and detecting secondary electrons emitted from the inspection substrate due to the irradiation with the electron beams. With regard to inspection apparatuses using electron beams, development is also in progress for apparatuses using multiple beams. When an image for inspection is taken with electron beams, there is a case where a line-like or band-like pseudo pattern, which does not exist originally, is imaged along and outside a figure pattern. Although the cause of this pseudo pattern is not obvious, there may be an influence of charging. There has been a problem that, if an inspection is performed using the acquired image as it is, the portion being the pseudo pattern is determined to be a defect, thereby resulting in generating a pseudo defect.

Regarding the influence of charging, a method is disclosed where, since the edge parallel to the electron beam scan direction of an SEM image is darker than the vertical edge, by using parameter values based on this, a simulated SEM image is generated from design data (e.g., refer to Patent Literature 1).

CITATION LIST

Patent Literature

Patent Literature 1: JP-A-2013-246062

SUMMARY OF INVENTION

Technical Problem

One aspect of the present invention provides an inspection apparatus and method that can reduce a pseudo defect due to a line-like or band-like pseudo pattern, which does not originally exist, along and outside a figure pattern, in an electron beam inspection.

Solution to Problem

According to one aspect of the present invention, an electron beam inspection apparatus includes
  an image acquisition mechanism configured to acquire a secondary electron image by scanning a substrate, on which a figure pattern is formed, with an electron beam, and detecting a secondary electron emitted due to irradiation with the electron beam by the scanning;
  a resize processing unit configured to perform, using design pattern data being a basis of the figure pattern, resize processing on the figure pattern to enlarge its size in a scan direction of the electron beam;
  a first developed image generation unit configured to generate, using the design pattern data which has not been resized, a first developed image by developing an image of a design pattern of a region corresponding to the secondary electron image;
  a second developed image generation unit configured to generate, using partial patterns enlarged by the resize processing in the figure pattern having been resized, a second developed image by developing an image of partial patterns in a region corresponding to the secondary electron image;
  a map generation unit configured to generate a pseudo defect candidate pixel map which can identify a pseudo defect candidate pixel that has no pattern in the first developed image and has a pattern in the second developed image;
  a reference image generation unit configured to generate a reference image of the region corresponding to the second electron image; and
  a comparison unit configured to compare, using the pseudo defect candidate pixel map, the second electron image with the reference image of the region corresponding to the second electron image.

According to another aspect of the present invention, an electron beam inspection apparatus includes
an image acquisition mechanism configured to acquire a secondary electron image by scanning a substrate, on which a figure pattern is formed, with an electron beam, and detecting a secondary electron emitted due to irradiation with the electron beam by the scanning;
a resize processing unit configured to perform, using design pattern data being a basis of the figure pattern, resize processing on the figure pattern to enlarge its size in a scan direction of the electron beam;
a first developed image generation unit configured to generate, using the design pattern data which has not been resized, a first developed image by developing an image of a design pattern of a region corresponding to the secondary electron image;
a second developed image generation unit configured to generate, using partial patterns enlarged by the resize processing in the figure pattern having been resized, a second developed image by developing an image of partial patterns in a region corresponding to the secondary electron image;
a map generation unit configured to generate a pseudo defect candidate pixel map which can identify a pseudo defect candidate pixel that has no pattern in the first developed image and has a pattern in the second developed image;
an extraction unit configured to extract a pixel in a region with no pattern in the secondary electron image;
a correction unit configured to correct a gray-scale value of the pseudo defect candidate pixel by replacing the gray-scale value of the pseudo defect candidate pixel in the secondary electron image by a value determined based on a gray-scale value of a pixel in a region with no pattern;
a reference image generation unit configured to generate a reference image of the region corresponding to the secondary electron image; and
a comparison unit configured to compare the secondary electron image in which the gray-scale value of the pseudo defect candidate pixel has been corrected with the reference image of the region corresponding to the secondary electron image.

According to yet another aspect of the present invention, an electron beam inspection method includes
acquiring a secondary electron image by scanning a substrate, on which a figure pattern is formed, with an electron beam, and detecting a secondary electron emitted due to irradiation with the electron beam by the scanning;
resizing, using design pattern data being a basis of the figure pattern, the figure pattern to enlarge its size in a scan direction of the electron beam;
generating, using the design pattern data which has not been resized, a first developed image by developing an image of a design pattern of a region corresponding to the secondary electron image;
generating, using partial patterns enlarged by the resizing in the figure pattern having been resized, a second developed image by developing an image of partial patterns in a region corresponding to the secondary electron image;
generating a pseudo defect candidate pixel map which can identify a pseudo defect candidate pixel that has no pattern in the first developed image and has a pattern in the second developed image;
generating a reference image of the region corresponding to the second electron image; and
comparing, using the pseudo defect candidate pixel map, the second electron image with the reference image of the region corresponding to the second electron image, and outputting a result.

Advantageous Effects of Invention

According to one aspect of the present invention, in an electron beam inspection, it is possible to reduce a pseudo defect due to a line-like or band-like pseudo pattern, which does not originally exist, along and outside a figure pattern.

DESCRIPTION OF EMBODIMENTS

Embodiments below describe an electron beam inspection apparatus as an example of an electron beam image acquisition apparatus. However, the electron beam image acquisition apparatus is not limited to an inspection apparatus, and it may be an apparatus that acquires an image by applying electron beams by using an electron optical system. Further, a configuration employing multiple electron beams is described below, but it is not limited thereto. A configuration using a single beam is also acceptable.

Embodiment 1

Figure 1:
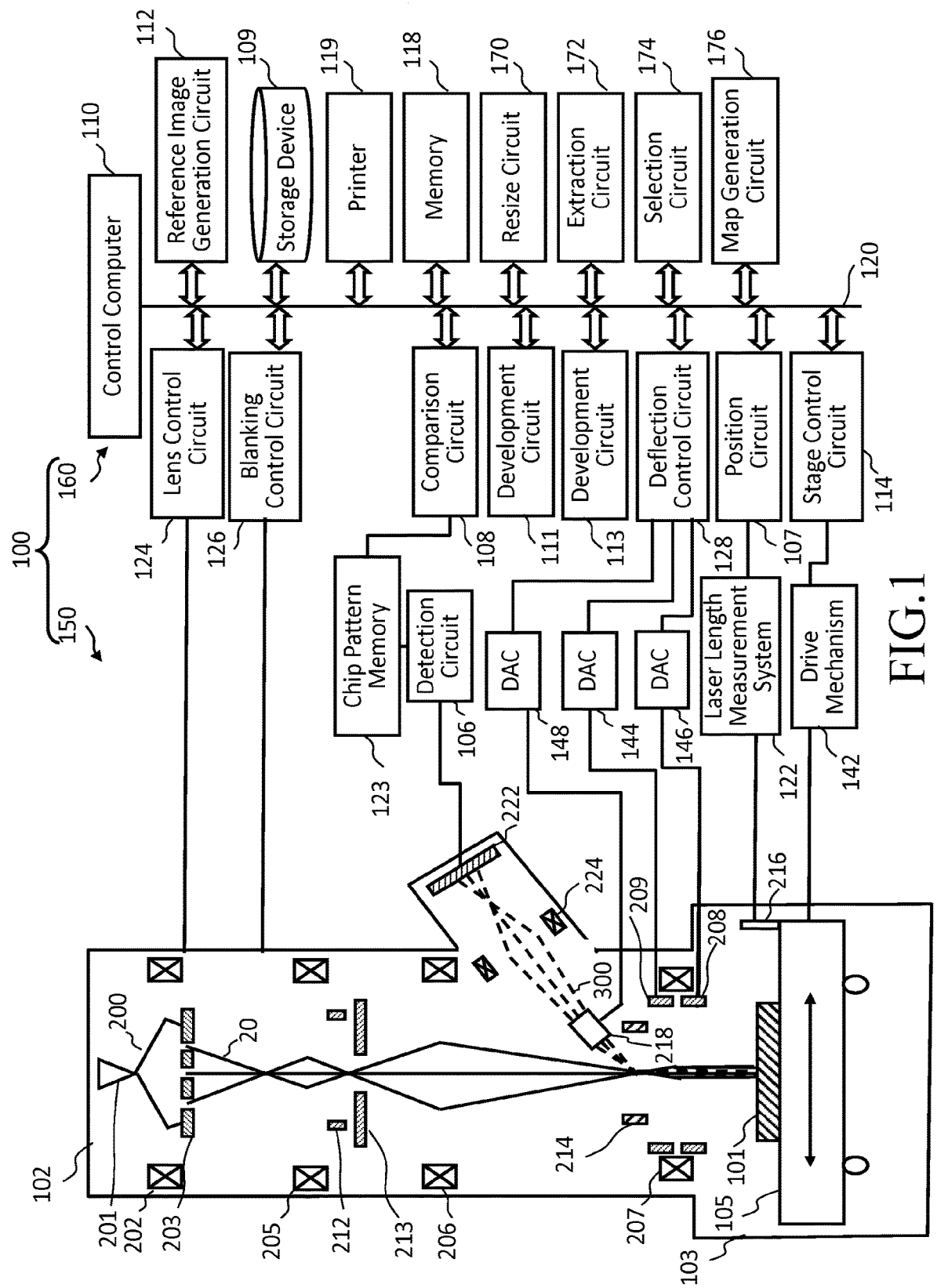
FIG. 1 is a diagram showing a configuration of a pattern inspection apparatus according to an embodiment 1.
Figure 11:
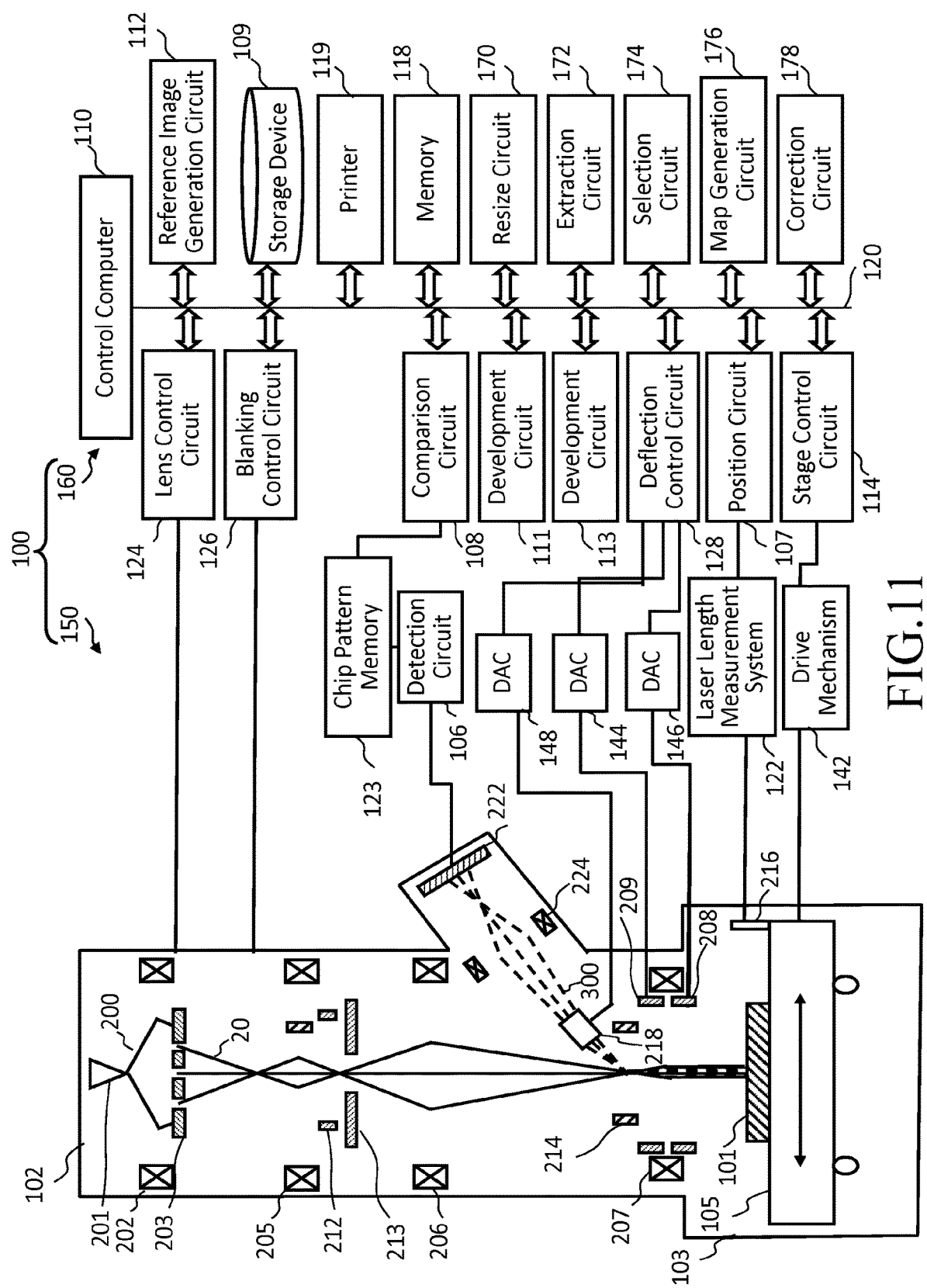
FIG. 11 is a diagram showing a configuration of a pattern inspection apparatus according to an embodiment 2.

FIG. 1 is a configuration diagram showing an example of a pattern inspection apparatus according to an embodiment 1. In FIG. 11, an inspection apparatus 100 for inspecting a pattern formed on the substrate is an example of a multi electron beam inspection apparatus. The inspection apparatus 100 includes an image acquisition mechanism 150 and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a bundle blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, and a multi-detector 222. The primary electron optical system is composed of the electron gun 201, the electromagnetic lens 202, the shaping aperture array substrate 203, the electromagnetic lens 205, the bundle blanking deflector 212, the limiting aperture substrate 213, the electromagnetic lens 206, the electromagnetic lens 207 (objective lens), the main deflector 208, and the sub deflector 209. The secondary electron optical system is composed of the electromagnetic lens 207, the beam separator 214, the deflector 218, and the electromagnetic lens 224.

In the inspection chamber 103, there is disposed a stage 105 movable at least in the x and y directions. A substrate 101 (target object) to be an inspection target is mounted on the stage 105. The substrate 101 may be an exposure mask substrate, or a semiconductor substrate such as a silicon wafer. In the case of the substrate 101 being a semiconductor substrate, a plurality of chip patterns (wafer dies) are formed on the semiconductor substrate. In the case of the substrate 101 being an exposure mask substrate, a chip pattern is formed on the exposure mask substrate. The chip pattern is composed of a plurality of figure patterns. When the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is mainly described below. The substrate 101 is placed with its pattern-forming surface facing upward on the stage 105, for example. Further, on the stage 105, there is disposed a mirror 216 which reflects a laser beam for measuring a laser length emitted from a laser length measuring system 122 arranged outside the inspection chamber 103. The multi-detector 222 is connected, at the outside of the electron beam column 102, to a detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, development circuits 111 and 113, a reference image generation circuit 112, a stage control circuit 114, a lens control circuit 124, a blanking control circuit 126, a deflection control circuit 128, a resize circuit 170, an extraction circuit 172, a selection circuit 174, a map generation circuit 176, a storage device 109 such as a magnetic disk drive, a monitor 117, a memory 118, and a printer 119. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the comparison circuit 108. The stage 105 is driven by a drive mechanism 142 under the control of the stage control circuit 114. In the drive mechanism 142, for example, a drive system such as a three (x-, y-, and θ-) axis motor which provides drive in the directions of x, y, and θ in the stage coordinate system is configured, and the stage 105 can move in the x, y, and θ directions. A step motor, for example, can be used as each of these x, y, and θ motors (not shown). The stage 105 is movable in the horizontal direction and the rotation direction by the x-, y-, and θ-axis motors. The movement position of the stage 105 is measured by the laser length measuring system 122, and supplied to the position circuit 107. Based on the principle of laser interferometry, the laser length measuring system 122 measures the position of the stage 105 by receiving a reflected light from the mirror 216. In the stage coordinate system, the x, y, and θ directions are set, for example, with respect to a plane perpendicular to the optical axis of multiple primary electron beams 20.

The electromagnetic lenses 202, 205, 206, 207 (objective lens), and 224, and the beam separator 214 are controlled by the lens control circuit 124. The bundle blanking deflector 212 is composed of two or more electrodes, and each electrode is controlled by the blanking control circuit 126 through a DAC amplifier (not shown). The sub deflector 209 is composed of four or more electrodes, and each electrode is controlled by the deflection control circuit 128 through the DAC amplifier 144. The main deflector 208 is composed of four or more electrodes, and each electrode is controlled by the deflection control circuit 128 through the DAC amplifier 146. The deflector 218 is composed of four or more electrodes, and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, a voltage is applied to another extraction electrode (Wehnelt), and the cathode is heated to a predetermined temperature, and thereby, electrons from the cathode are accelerated to be emitted as an electron beam 200.

FIG. 1 shows a configuration necessary for describing the embodiment 1. Other configuration generally necessary for the inspection apparatus 100 may also be included therein.

Figure 2:
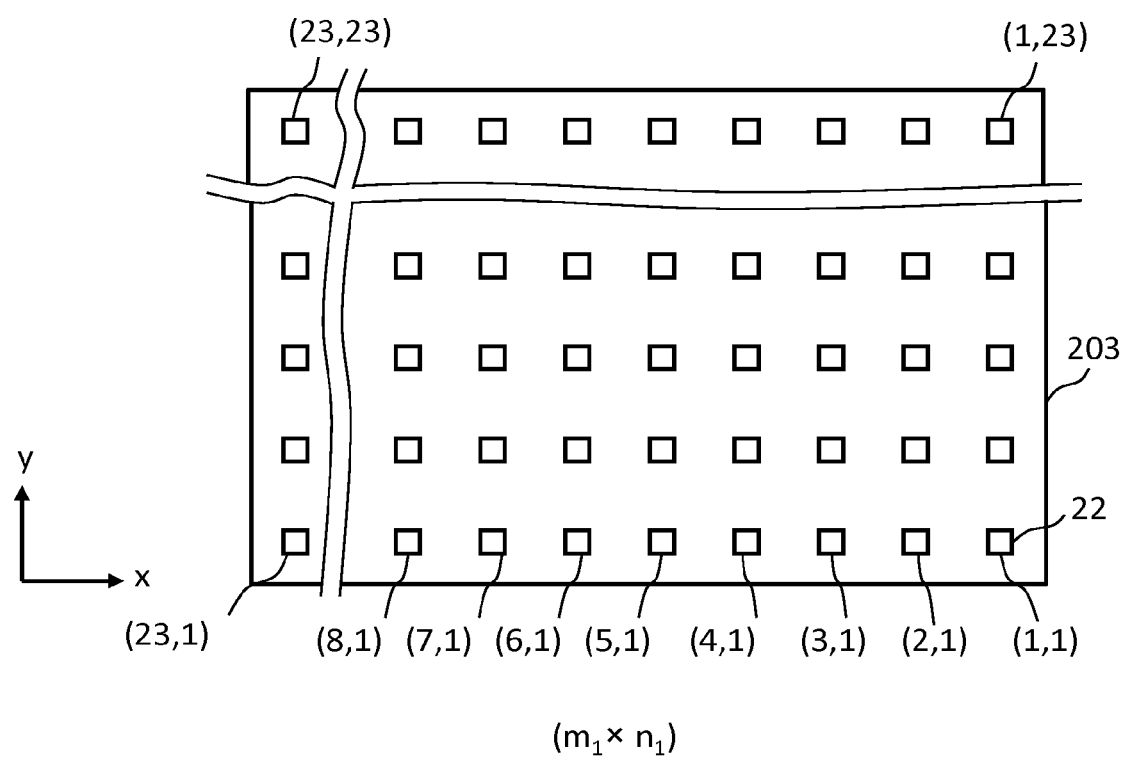
FIG. 2 is a conceptual diagram showing a configuration of a shaping aperture array substrate according to the embodiment 1.

FIG. 2 is a conceptual diagram showing a configuration of a shaping aperture array substrate according to the embodiment 1. In FIG. 2, holes (openings) 22 of $m_1$ columns wide (x direction)$\times n_1$ rows long (y direction) ($m_1$ and $n_1$ are integers of 2 or more) are two-dimensionally formed in the x and y directions at a predetermined arrangement pitch in the shaping aperture array substrate 203. In the case of FIG. 2, holes 22 of 23×23 are formed. Each of the holes 22 is a rectangle having the same dimension and shape. Alternatively, each of the holes 22 may be a circle with the same outer diameter. Multiple primary electron beams 20 are formed by letting portions of the electron beam 200 individually pass through a plurality of holes 22. Although the case where the holes 22 of two or more rows and columns are arranged in both the x and y directions is here shown, the arrangement is not limited thereto. For example, it is also acceptable that one row (y direction)×a plurality of columns (x direction), or in one column (x direction)×a plurality of rows (y direction). Further, the method of arranging the holes 22 is not limited to the case of FIG. 2 where the holes are arranged like a grid in the width and length directions. For example, with respect to the x-direction kth and (k+1)th rows which are arrayed in the length direction (in the y direction), each hole in the kth row and each hole in the (k+1)th row may be arranged mutually displaced in the width direction (in the x direction) by a dimension "a". Similarly, with respect to the x-direction (k+1)th and the (k+2)th rows which are arrayed in the length direction (in the y direction), each hole in the (k+1)th row and each hole in the (k+2)th row may be arranged mutually displaced in the width direction (in the x direction) by a dimension "b".

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all of the plurality of holes 22 is irradiated by the electron beam 200. The multiple primary electron beams 20 are formed by letting portions of the electron beam 200, which irradiate the positions of the plurality of holes 22, individually pass through the plurality of holes 22 in the shaping aperture array substrate 203.

The formed multiple primary electron beams 20 are individually refracted by the electromagnetic lenses 205 and 206, and travel to the electromagnetic lens 207 (objective lens), while repeating forming an intermediate image and a crossover, through the beam separator 214 arranged on the intermediate image plane (position conjugate to the image plane) of each beam of the multiple primary electron beams 20.

When the multiple primary electron beams 20 are incident on the electromagnetic lens 207 (objective lens), the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 so as to irradiate respective beam irradiation positions on the substrate 101. When all of the multiple primary electron beams 20 are collectively deflected by the bundle blanking deflector 212, they deviate from the hole in the center of the limiting aperture substrate 213 and are blocked by the limiting aperture substrate 206. On the other hand, the multiple primary electron beams 20 which were not deflected by the bundle blanking deflector 212 pass through the hole in the center of the limiting aperture substrate 206 as shown in FIG. 1. Blanking control is provided by On/Off of the bundle blanking deflector 212, and thus On/Off of the beams is collectively controlled. Thus, the limiting aperture substrate 206 blocks the multiple primary electron beams 20 which were deflected to be in the "Off condition" by the bundle blanking deflector 212. Then, the multiple primary electron beams 20 for inspection (for image acquisition) are formed by beams having been made during a period from becoming "beam On" to becoming "beam Off" and having passed through the limiting aperture substrate 206.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be perpendicular to each other in a plane orthogonal to the traveling direction (trajectory central axis) of the center beam of the multiple primary electron beams 20. The electric field exerts a force in a fixed direction regardless of the traveling direction of electrons. In contrast, the magnetic field exerts a force according to Fleming's left-hand rule. Therefore, the direction of force acting on electrons can be changed depending on the entering direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 bent obliquely upward and separated from the multiple primary electron beams 20 are further bent by the deflector 218, and projected, while being refracted, onto the multi-detector 222 by the electromagnetic lens 224. The multi-detector 222 detects the projected multiple secondary electron beams 300. The multi-detector 222 includes, for example, a diode type two-dimensional sensor (not shown). Then, at the position of a diode type two-dimensional sensor corresponding to each beam of the multiple primary electron beams 20, each secondary electron of the multiple secondary electron beams 300 collides with the diode type two-dimensional sensor, so that electrons are generated and secondary electron image data is produced for each pixel. An intensity signal detected by the multi-detector 222 is output to the detection circuit 106.

Figure 3:
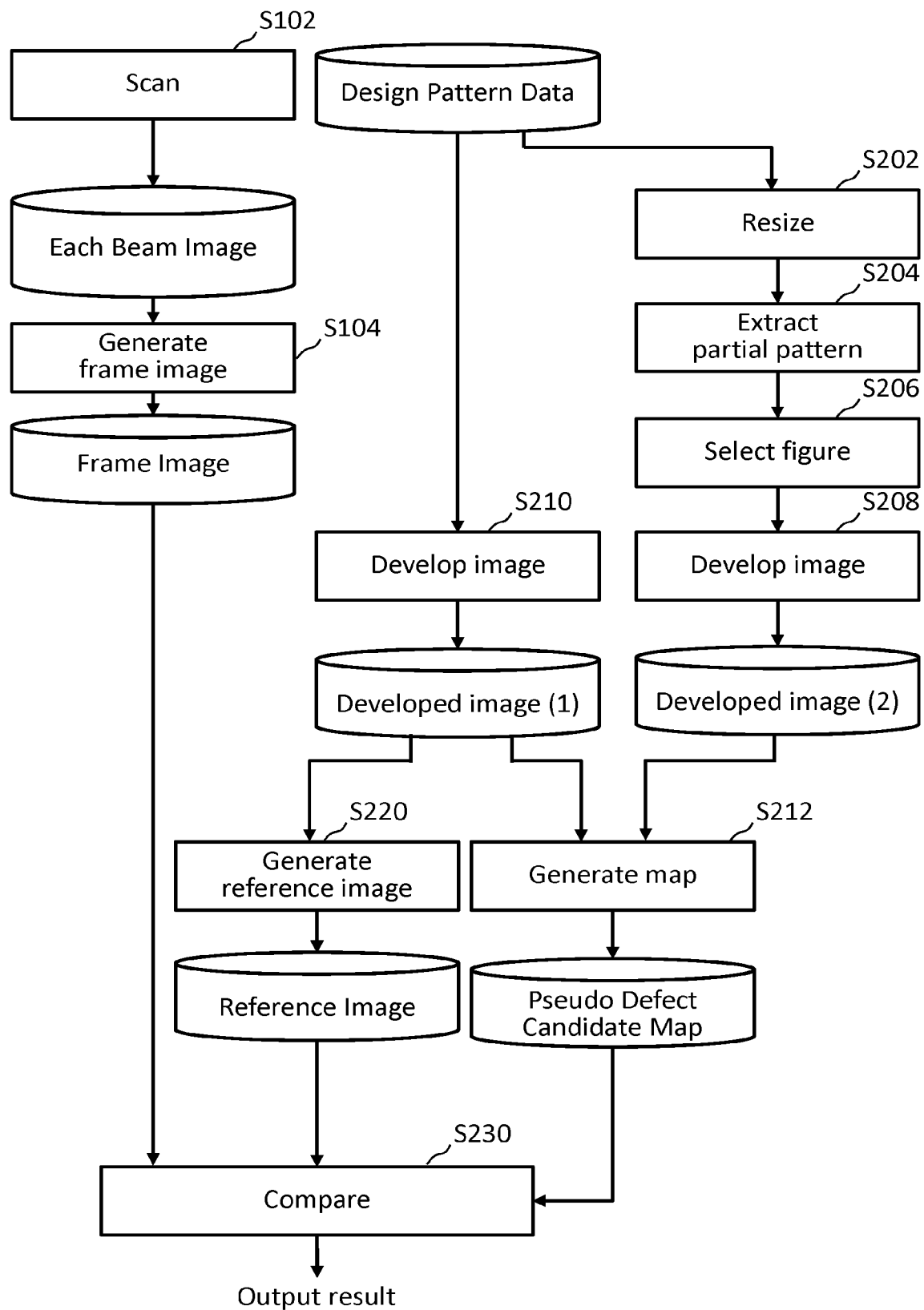
FIG. 3 is a flowchart showing main steps of an inspection method according to the embodiment 1.

FIG. 3 is a flowchart showing main steps of an inspection method according to the embodiment 1. In FIG. 3, the inspection method of the embodiment 1 executes a series of steps: a scanning step (S102), a frame image generation step (S104), a resizing step (S202), a partial pattern extraction step (S204), a figure selection step (S206), an image development step (S208), an image development step (S210), a map generation step (S212), a reference image generation step (S220), and a comparison step (S230).

In the scanning step (S102), the image acquisition mechanism 150 scans the substrate 101, on which a plurality of figure patterns are formed, with the multiple primary electron beams 20 (electron beams) to acquire a secondary electron image by detecting the multiple secondary electron beams 300 (secondary electrons) emitted due to the scanning irradiation with the multiple primary electron beams 20.

Figure 4:
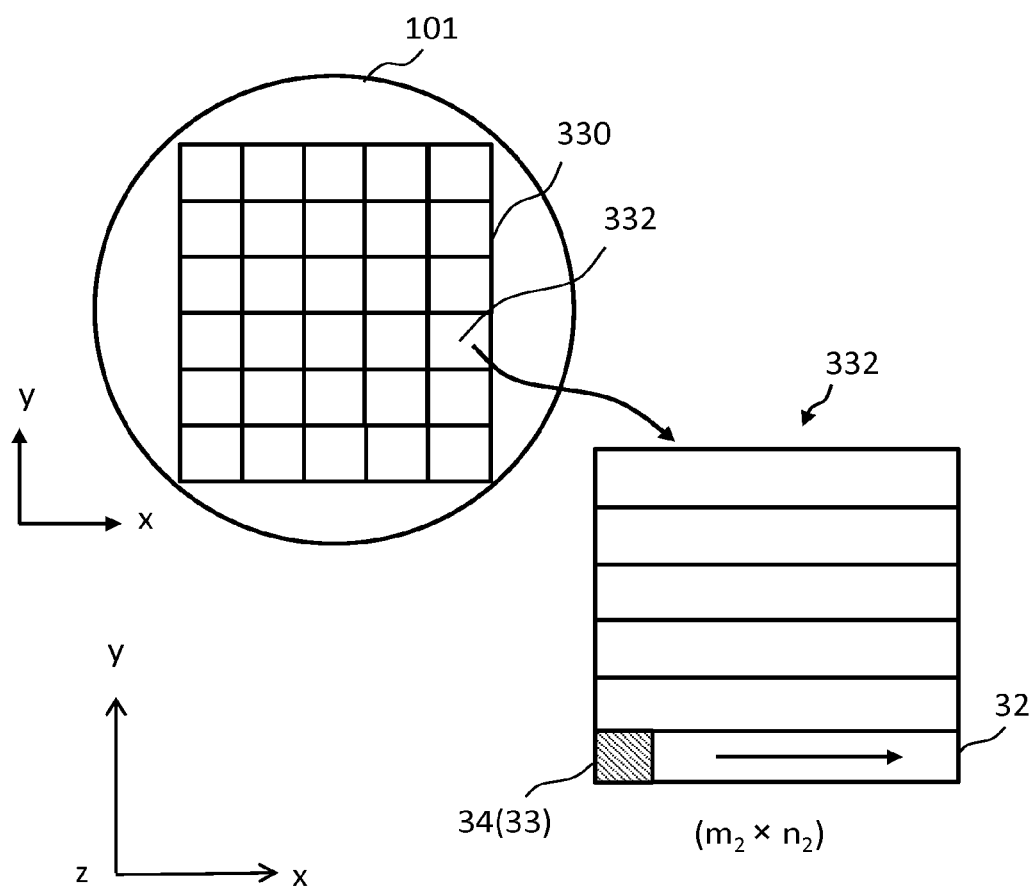
FIG. 4 is a diagram showing an example of a plurality of chip regions formed on a semiconductor substrate according to the embodiment 1.

FIG. 4 is a diagram showing an example of a plurality of chip regions formed on a semiconductor substrate, according to the embodiment 1. In FIG. 4, in the case of the substrate 101 being a semiconductor substrate (wafer), a plurality of chips (wafer dies) 332 in a two-dimensional array are formed in an inspection region 330 of the semiconductor substrate (wafer). With respect to each chip 332, a mask pattern for one chip formed on an exposure mask substrate is reduced to ¼, for example, and exposed/transferred onto each chip 332 by an exposure device (stepper) (not shown). The region of each chip 332 is divided, for example, in the y direction into a plurality of stripe regions 32 by a predetermined width. The scanning operation by the image acquisition mechanism 150 is carried out for each stripe region 32, for example. The operation of scanning the stripe region 32 advances relatively in the x direction while the stage 105 is moved in the –x direction, for example. Each stripe region 32 is divided in the longitudinal direction into a plurality of rectangular regions 33. Beam moving to a target rectangular region 33 is achieved by collectively deflecting all the multiple primary electron beams 20 by the main deflector 208.

Figure 5:
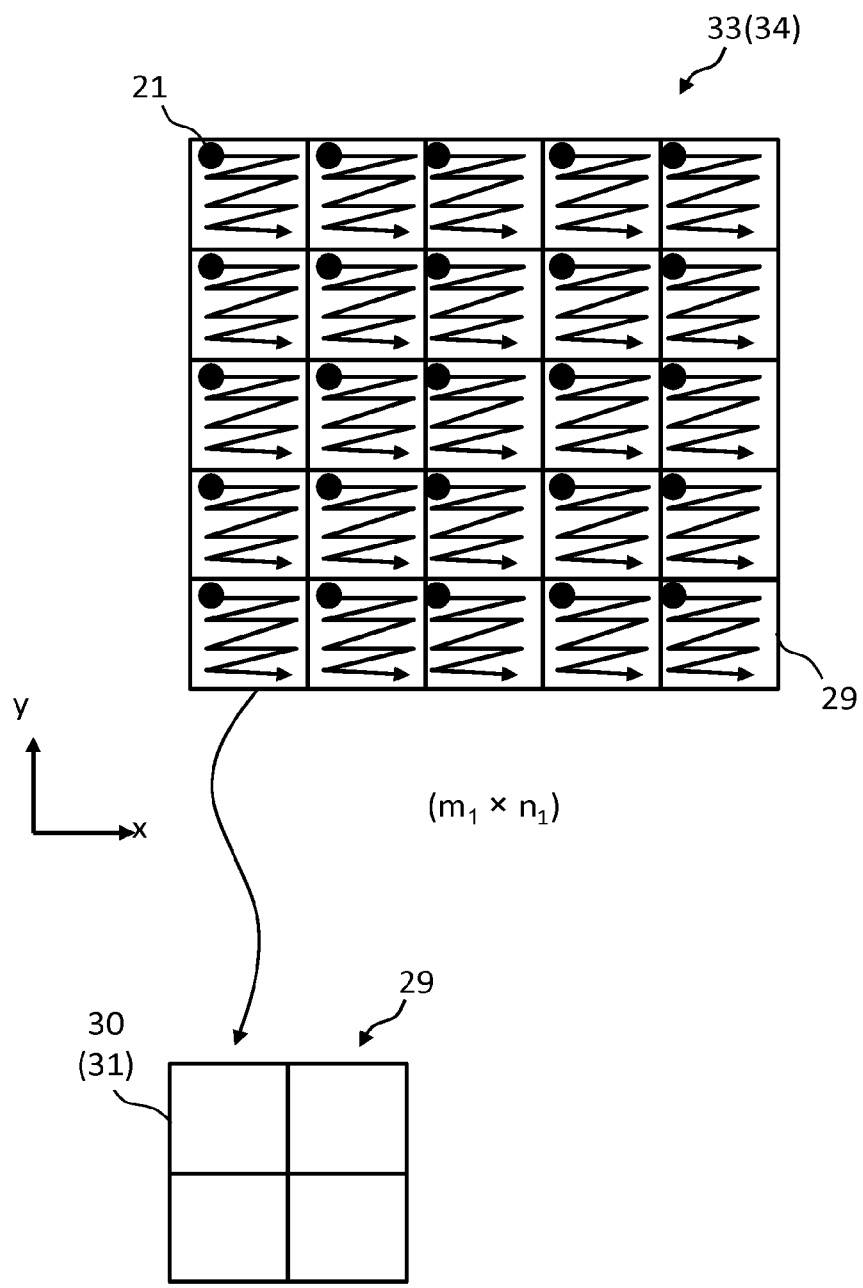
FIG. 5 is a diagram illustrating a scanning operation with multiple beams according to the embodiment 1.

FIG. 5 is a diagram illustrating a scanning operation with multiple beams according to the embodiment 1. FIG. 5 shows the case of the multiple primary electron beams 20 of 5 rows×5 columns. An irradiation region 34 which can be irradiated by one irradiation with the multiple primary electron beams 20 is defined by (x direction size obtained by multiplying a beam pitch in the x direction of the multiple primary electron beams 20 on the substrate 101 by the number of beams in the x direction)×(y direction size obtained by multiplying a beam pitch in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 4 and 5, the irradiation region 34 and the rectangular region 33 are of the same size. However, it is not limited thereto. The irradiation region 34 may be smaller than the rectangular region 33, or larger than it. Each primary electron beam 21 of the multiple primary electron beams 20 irradiates and scans the inside of a sub-irradiation region 29 which is surrounded by the beam pitch in the x direction and the beam pitch in the y direction and in which the beam concerned itself is located. Each primary electron beam 21 is associated with any one of the sub-irradiation regions 29 which are different from each other. In the example of FIG. 5, each primary electron beam 21 performs line scanning, in x direction as a scan direction, in the sub-irradiation region 29. At the time of each shot, each primary electron beam 21 is applied to the same position in the associated sub-irradiation region 29. The primary electron beam 21 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 21. Then, when scanning of one sub-irradiation region 29 is completed, the irradiation position is moved to an adjacent rectangular region 33 in the same stripe region 32 by collectively deflecting all of the multiple primary electron beams 20 by the main deflector 208. By repeating this operation, the inside of the stripe region 32 is irradiated in order. After completing scanning of one stripe region 32, the irradiation position is moved to the next stripe region 32 by moving the stage 105 and/or by collectively deflecting all of the multiple primary electron beams 20 by the main deflector 208. As described above, by irradiation with each primary electron beam 21, a scanning operation and a secondary electron image acquisition of each sub-irradiation region 29 is performed. By combining secondary electron images of respective sub-irradiation regions 29, a secondary electron image of the rectangular region 33, a secondary electron image of the stripe region 32, or a secondary electron image of the chip 332 is configured. When an image comparison is actually performed, the sub-irradiation region 29 in each rectangular region 33 is further divided into a plurality of frame regions 30, and a frame image 31 of each frame region 30 is compared. FIG. 5 shows the case of dividing the sub-irradiation region 29 which is scanned with one primary electron beam 21 into two in the x and y directions, thereby dividing into four frame regions 30.

It is also preferable to group, for example, a plurality of chips 332 aligned in the x direction in the same group, and to divide each group into a plurality of stripe regions 32 by a predetermined width in the y direction, for example. Then, moving between stripe regions 32 is not limited to moving per chip 332, and it is also preferable to move per group.

When the multiple primary electron beams 20 irradiate the substrate 101 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, when the inside of the sub-irradiation region 29 is scanned, the emission position of each secondary electron beam changes every second in the sub-irradiation region 29. Thus, the deflector 218 collectively deflects the multiple secondary electron beams 300 so that each secondary electron beam whose emission position has changed as described above may be applied to a corresponding detection region of the multi-detector 222.

For acquiring an image, as described above, the multiple primary electron beams 20 are applied to the substrate 101 so that the multi-detector 222 may detect the multiple secondary electron beams 300 including reflected electrons emitted from the substrate 101 due to the irradiation with the multiple primary electron beams 20. Detected data (measured image data: secondary electron image data: inspection image data) on a secondary electron of each pixel in each sub-irradiation region 29 detected by the multi-detector 222 is output to the detection circuit 106 in order of measurement. In the detection circuit 106, the detected data in analog form is converted into digital data by an A-D converter (not shown), and stored in the chip pattern memory 123. Then, the acquired measured image data is transmitted to the comparison circuit 108, together with information on each position from the position circuit 107.

Figure 6:
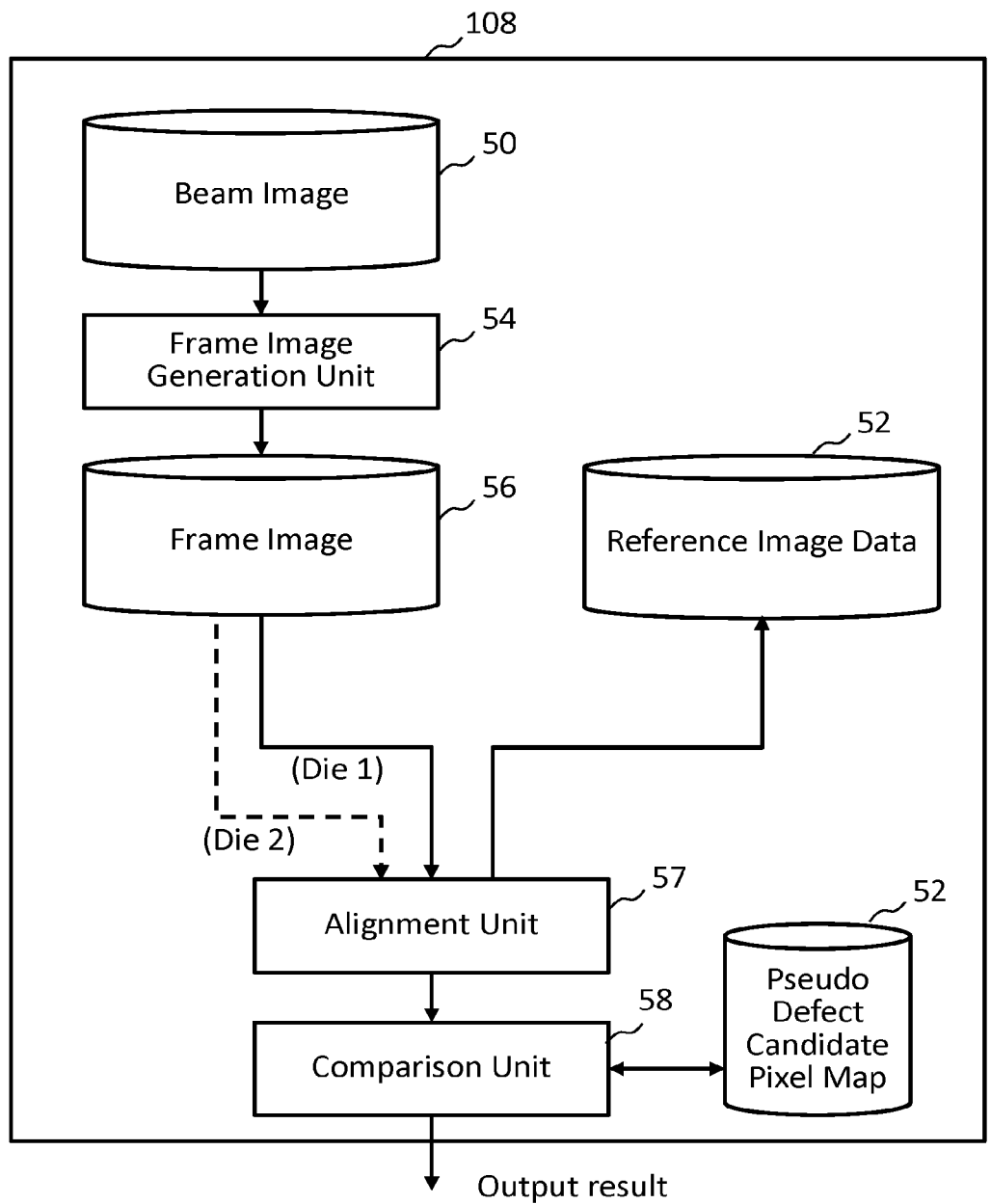
FIG. 6 is a diagram showing an example of an internal configuration of a comparison circuit according to the embodiment 1.

FIG. 6 is a diagram showing an example of an internal configuration of a comparison circuit according to the embodiment 1. In FIG. 6, storage devices 50, 51, 52 and 56, such as magnetic disk drives, a frame image generation unit 54, an alignment unit 57, and a comparison unit 58 are arranged in the comparison circuit 108. Each of the "units" such as the frame image generation unit 54, the alignment unit 57 and the comparison unit 58 includes processing circuitry. As the processing circuitry, an electric circuit, computer, processor, circuit board, quantum circuit, semiconductor device, or the like can be used. Further, common processing circuitry (same processing circuitry), or different processing circuitry (separate processing circuitry) may be used for each of the "units". Input data required in the frame image generation unit 54, the alignment unit 57 and the comparison unit 58, or a calculated result is stored in a memory (not shown) or in the memory 118 each time.

The measured image data (beam image) transmitted into the comparison circuit 108 is stored in the storage device 50.

In the frame image generation step (S104), the frame image generation unit 54 generates the frame image 31 of each of a plurality of frame regions 30 obtained by further dividing the image data of the sub-irradiation region 29 acquired by scanning with each primary electron beam 21. The frame region 30 is used as a unit region of the inspection image. In order to prevent missing an image, it is preferable that margin regions overlap each other in each frame region 30. The generated frame image 31 is stored in the storage device 56.

Figure 7:
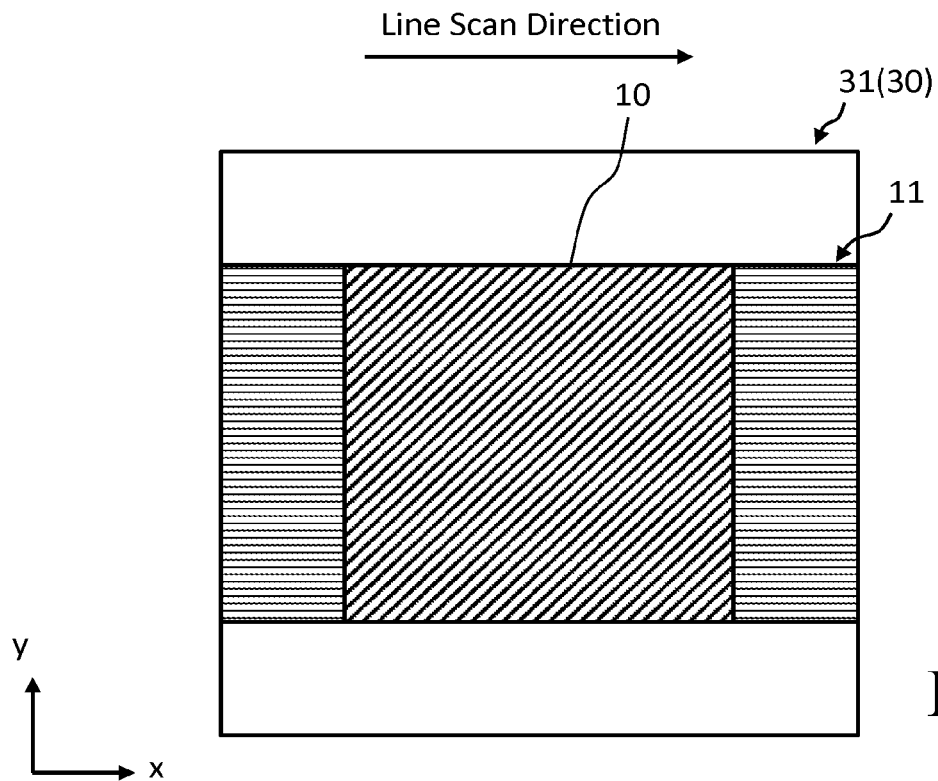
FIG. 7 is a diagram illustrating an example of a frame image including a pseudo pattern according to the embodiment 1.

FIG. 7 is a diagram illustrating an example of a frame image including a pseudo pattern according to the embodiment 1. FIG. 7 shows the case where a rectangular figure pattern 10 is arranged in the frame image 31. Although FIG. 7 shows, for easily understanding the description, the case where only one figure pattern 10 is arranged in the frame image 31, a plurality of figure patterns may be arranged. As described above, each electron beam 21 scans the inside of the sub-irradiation region 29, in a line scan direction (e.g., x direction). As a result, as shown in FIG. 7, there is a case where a line-like or band-like pseudo pattern 11, which does not exist originally, is imaged along, outside the figure pattern 10, a scan direction from the end of the figure pattern 10. As shown in FIG. 7, in many cases, the line-like or band-like pseudo pattern 11 is generated having a width of between the two edges parallel to the line scan direction of the figure pattern 10.

Figure 8:
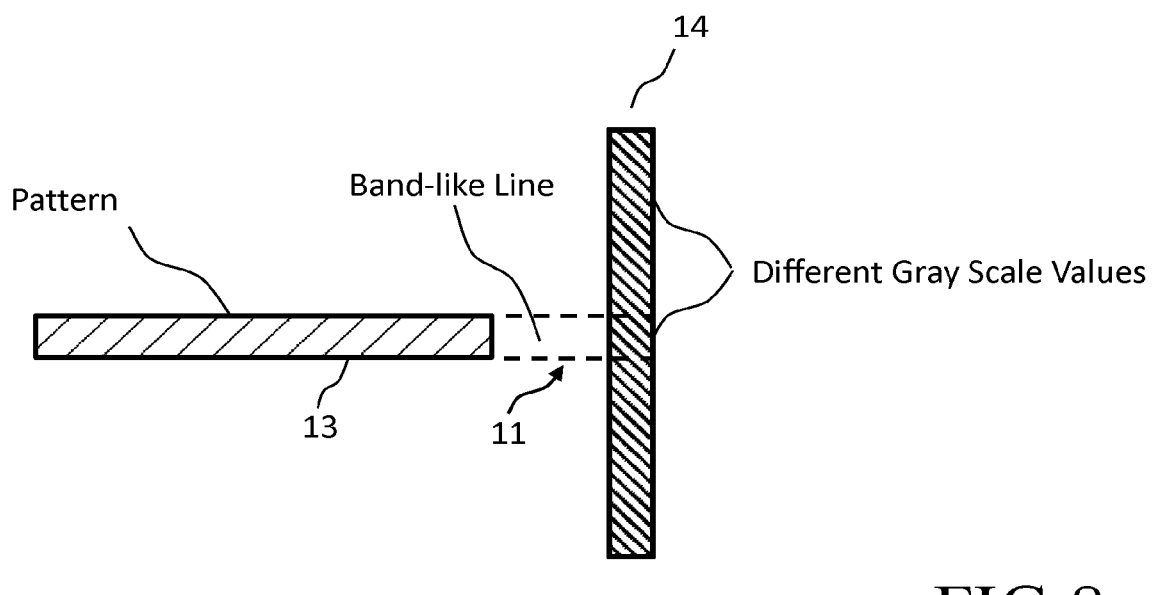
FIG. 8 is a diagram illustrating another example of a frame image including a pseudo pattern according to the embodiment 1.

FIG. 8 is a diagram illustrating another example of a frame image including a pseudo pattern according to the embodiment 1. The example of FIG. 8 shows a rectangular pattern 13 extending along a line scan direction (x direction) and a rectangular pattern 14 extending along a direction (y direction) orthogonal to the line scan direction. The rectangular pattern 14 is arranged against the rectangular pattern 13, with a predetermined space in the line scan direction. In the example of FIG. 8, there is a case where the line-like or band-like pseudo pattern 11, which does not exist originally, is imaged along, outside the rectangular pattern 13, a scan direction from the end of the rectangular pattern 13 having a large size width in the line scan direction. On the other hand, the line-like or band-like pseudo pattern 11 is not generated from the end of the rectangular pattern 14 having a small size width in the line scan direction. Thus, it turns out that the imaged pseudo pattern 11 is generated associated with a figure pattern having a width size more than a predetermined size in the line scan direction. Further, it also turns out that, due to the pseudo pattern 11 generated from the end of the rectangular pattern 13 along the scan direction, the gray-scale value of image data detected for an overlapping portion of the rectangular pattern 14, which overlaps with the pseudo pattern 11, is different from that of the other portion of the rectangular pattern 14. Although the cause of the pseudo pattern 11 shown in FIGS. 7 and 8 is not obvious, there may be an influence of charging. If an inspection is performed using the acquired image as it is, there is a problem that the portion being the pseudo pattern is determined to be a defect, thereby resulting in generating a pseudo defect. Therefore, according to the embodiment 1, the region in which the pseudo pattern 11 may be generated is identified to loosen the inspection sensitivity of that region. Accordingly, as described below, the region in which the pseudo pattern 11 may be generated is identified as follows:

In the resizing step (S202), using design pattern data (design data) serving as bases of a plurality of figure patterns, the resize circuit 170 (resize processing unit) resizes, for each figure pattern, to enlarge the size of the figure pattern concerned, in the line scan direction (scan direction) of the electron beam 21.

Figure 9:
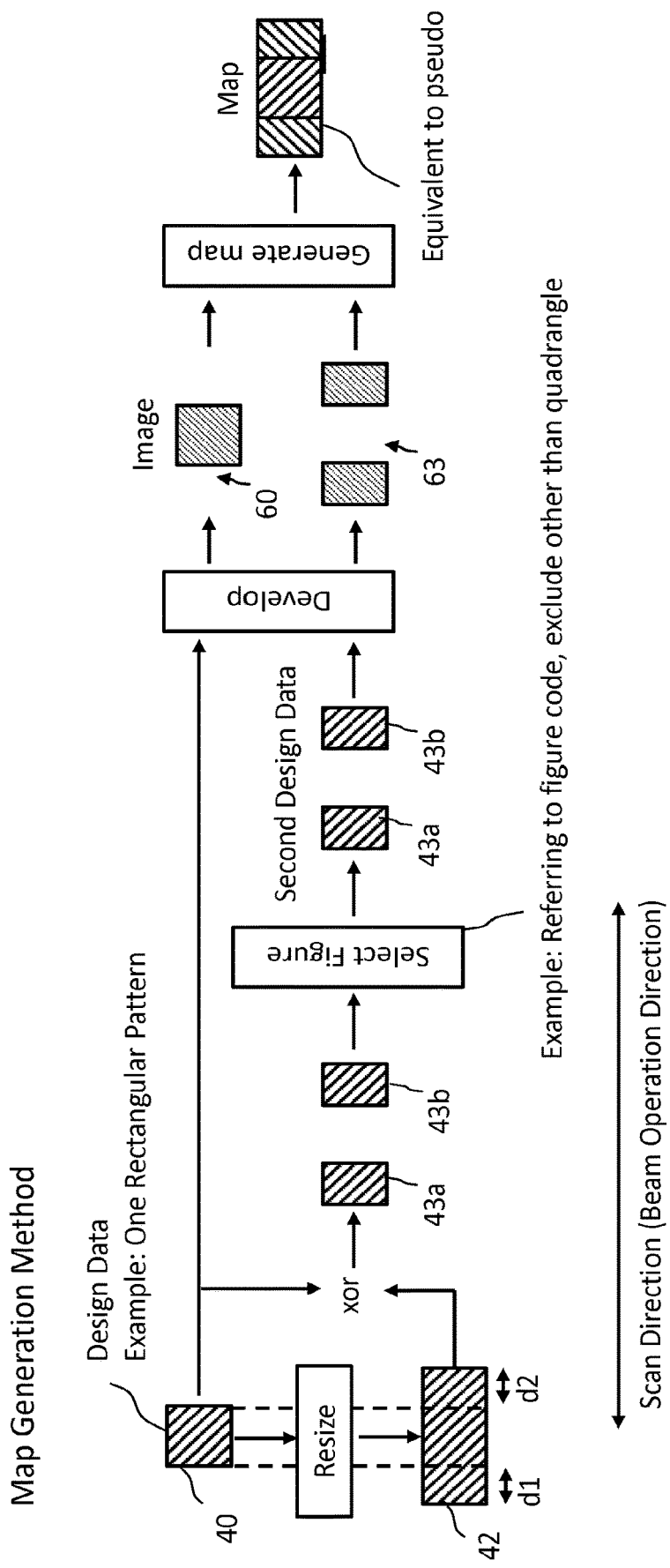
FIG. 9 is a diagram illustrating each step from resize processing to map generation according to the embodiment 1.

FIG. 9 is a diagram illustrating each step from resize processing to map generation according to the embodiment 1. In the example of FIG. 9, a rectangular pattern is shown as an example of a figure pattern 40. As shown in FIG. 9, the resize circuit 170 reads design pattern data on the inside of the target frame region 30 from the storage device 109, and enlarges the size of each figure pattern 40, in the line scan direction (scan direction) of the electron beam 21.

Figures defined by the design pattern data are, for example, rectangles (quadrangles) and triangles as basic figures. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like. In the case of FIG. 9, resize processing is performed along the line scan direction to enlarge one side of a rectangular pattern by the size d1 and the other side of it by the size d2. The size to expand is preferably a size obtained from the number of pixels occupied by the pseudo pattern 11 which extends along the scan direction from the end of the figure pattern 10, where the number of pixels is obtained in experiments and the like. For example, the light and dark tone of a pixel affected by charging is different from that of peripheral pixels. Then, the number of pixels having different light and dark tones may be measured with respect to the x and y directions. With respect to the direction perpendicular to the line scan direction, it is assumed that about the same width as that of the figure pattern is maintained. With respect to the line scan direction, enlargement is performed to match the size for five pixels, for example. The figure pattern 40 is not limited to a rectangular pattern, and may be, for example, a right-angled triangle pattern and like. Resize processing is also performed for a pattern other than a rectangle such that the size in the line scan direction is enlarged. Figure data of the figure pattern 42 having been resized also defines, similarly to the figure pattern 40, the shape, size, position, and the like of each pattern figure by using information, such as coordinates (x, y) of the reference position of the figure, lengths of sides of the figure, and a figure code serving as an identifier for identifying the figure type such as rectangles, triangles and the like. The figure data of the figure pattern 42 is stored in a memory (not shown) in the resize circuit 170, or in a storage device such as a magnetic disk drive. Alternatively, it is stored in the memory 118, etc.

In the partial pattern extraction step (S204), for each figure pattern 42 having been resized, the extraction circuit 172 extracts partial patterns 43a and 43b which have been enlarged by the resizing in the resized figure pattern 42. Specifically, for example, it operates as follows: The extraction circuit 172 extracts the partial patterns 43a and 43b by performing an exclusive OR (XOR) operation using the region of the figure pattern 42 after resizing, and the region of the figure pattern 40 before resizing. Figure data of the extracted partial patterns 43a and 43b also defines, similarly to the figure pattern 40, the shape, size, position, and the like of each pattern figure by using information, such as coordinates (x, y) of the reference position of the figure, lengths of sides of the figure, and a figure code serving as an identifier for identifying the figure type such as rectangles, triangles and the like. The figure data of the partial patterns 43a and 43b is stored in a memory (not shown) in the extraction circuit 172, or in a storage device such as a magnetic disk drive. Alternatively, it is stored in the memory 118, etc.

In the figure selection step (S206), the selection circuit 174 (selection unit) excludes partial patterns other than rectangles in the partial patterns 43a and 43b enlarged by resize processing. In other words, the selection circuit 174 selects a rectangular partial pattern from the partial patterns 43a and 43b. The pseudo pattern 11 tends to extend in the line scan direction from the end of the rectangular pattern which has a predetermined size in the line scan direction. Therefore, the pseudo pattern 11 is unlikely to be generated with respect to right-angled triangles. Then, right-angled triangles and the like whose partial patterns are not rectangles are excluded.

Although, in the example described above, figure selection is performed after extracting partial patterns, it is not limited thereto. It is also preferable to select rectangular patterns in the resize processing, as targets to be resized.

In the image development step (S208), using the partial patterns 43 which have been enlarged by the resizing in the resized figure pattern 42, the development circuit 111 (second developed image generation unit) generates developed images 63 (developed image (2): the second developed image) by developing the images of the partial patterns 43 of the frame region 30 corresponding to the frame image 31 (secondary electron image). When the figure data of each of the partial patterns 43 in the target frame region 30 is input to the development circuit 111, the figure code, figure dimensions, and the like indicating the figure shape in the figure data are interpreted. Then, it is developed to design pattern image data of binary values as a pattern to be arranged in squares in units of grids of predetermined quantization dimensions, and then is output. In other words, the figure data is read, and, for each square region obtained by virtually dividing the frame region 30 into squares in units of predetermined dimensions, becomes 2-bit occupancy data which defines a pixel overlapping with the partial patterns 43 to be 1, and a pixel not overlapping to be 2. Such square regions (inspection pixels) may be corresponding to pixels of measured data. The generated binary data (second developed pattern data) of the developed image 63 is output to the map generation circuit 176.

In the image development step (S210), using design pattern data which has not been resized, the development circuit 113 (first developed image generation unit) generates a developed image 60 (developed image (1): the first developed image) by developing the image of the design pattern of the frame region 30 corresponding to the frame image 31 (secondary electron image). First, design pattern data is read from the storage device 109 through the control computer 110, and each figure pattern defined by the read design pattern data is converted into image data of binary or multiple values.

When the design pattern data used as the figure data is input to the development circuit 113, the data is developed into data of each figure, and the figure code, figure dimensions, and the like indicating the figure shape in the figure data are interpreted. Then, it is developed to design pattern image data of binary or multiple values as a pattern to be arranged in squares in units of grids of predetermined quantization dimensions, and then is output. In other words, the design pattern data is read, the occupancy of a figure in the design pattern is calculated for each square region obtained by virtually dividing the inspection region into squares in units of predetermined dimensions, and n-bit occupancy data is output. For example, it is preferable to set one square as one pixel. Assuming that one pixel has a resolution of $1/2^8$ (=$1/256$), the occupancy rate in each pixel is calculated by allocating sub regions each being $1/256$ to the region of a figure arranged in the pixel. Then, it becomes 8-bit occupancy data. Such square regions (inspection pixels) may be corresponding to pixels of measured data. The generated data (first developed pattern data) of the developed image 60 is output to the reference image generation circuit 112 and the map generation circuit 176. If the developed image 60 has been developed to image data of multiple values (e.g., 256 gray scales from 0 to 255) larger than binary values (two gray scales of 0 and 1) by the development circuit 113, after it is converted to image data of binary values, the generated binary value data (first developed pattern data) of the developed image 60 is output to the map generation circuit 176. In each pixel, if the occupancy is equal to or greater than a threshold, it is defined to be 1, and if less than the threshold, it is defined to be 0, for example.

In the map generation step (S212), the map generation circuit 176 (map generation unit) generates a pseudo defect candidate pixel map which can identify a pseudo defect candidate pixel that has no pattern in the developed image 60 (first developed image) and has a pattern in the developed image 63 (second developed image).

Figure 10:
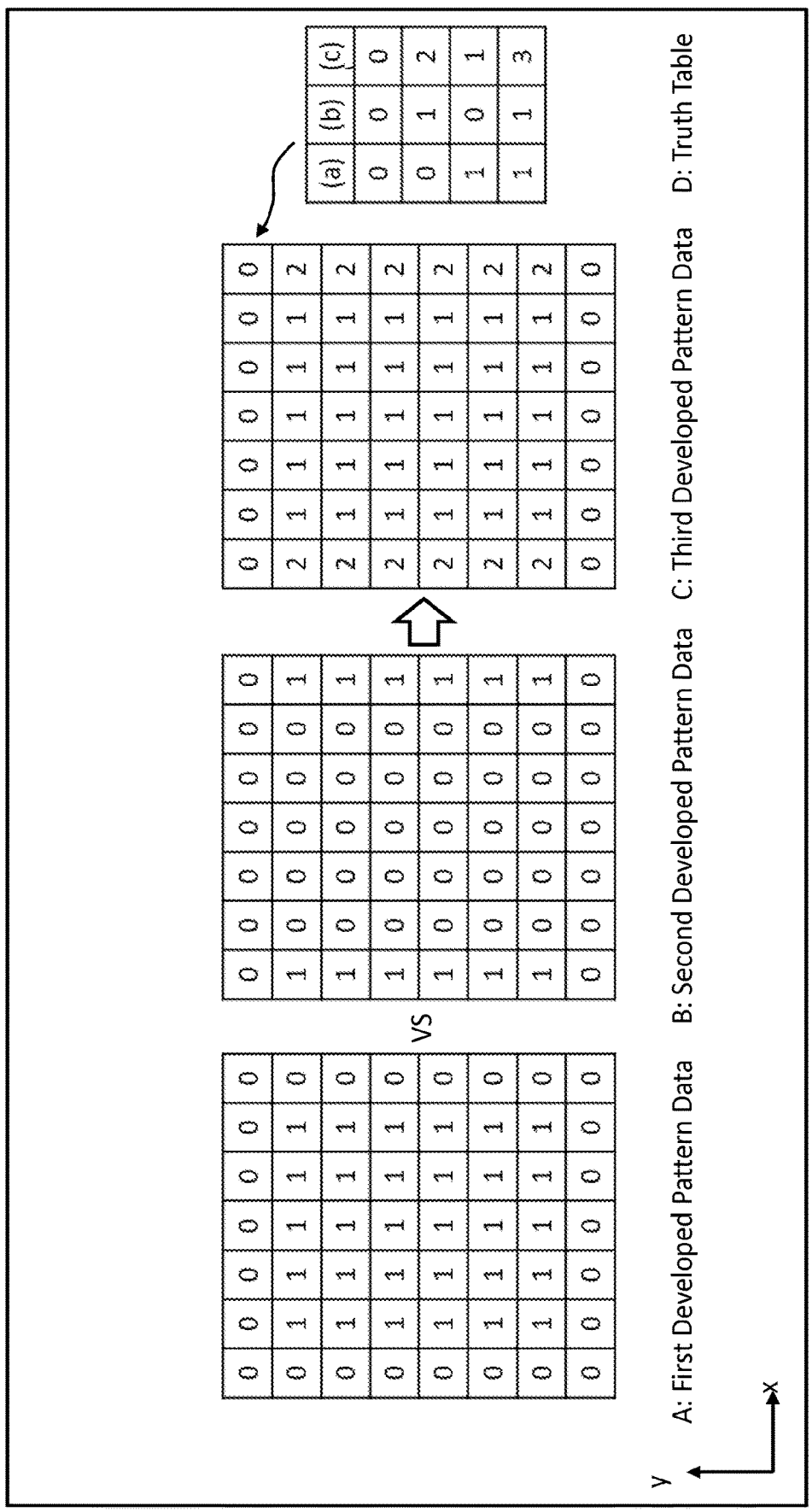
FIG. 10 is a diagram showing an example of a pseudo defect candidate pixel map according to the embodiment 1.

FIG. 10 is a table showing an example of a pseudo defect candidate pixel map according to the embodiment 1. In the data (first developed pattern data) of the developed image 60 (first developed image) shown in A of FIG. 10, a plurality of pixels at the center where the figure pattern 10 is arranged are defined to be 1, and the other regions are defined to be 0. In the data (second developed pattern data) of the developed image 63 (second developed image) shown in B of FIG. 10, pixels in the scan direction (x direction) from the both ends of the region where the figure pattern 10 is arranged are defined to be 1, and the other regions are defined to be 0. The map generation circuit 176 shows a truth table according to the embodiment 1 in D of FIG. 10. Based on the truth table, for each pixel, the map generation circuit 176 defines 0 in the pseudo defect candidate pixel map in the case of the developed image 60 shown in A of FIG. 10 being 0, and the developed image 63 shown in B of FIG. 10 being 0. The map generation circuit 176 defines 2 in the pseudo defect candidate pixel map in the case of the developed image 60 shown in A of FIG. 10 being 0, and the developed image 63 shown in B of FIG. 10 being 1. The map generation circuit 176 defines 1 in the pseudo defect candidate pixel map in the case of the developed image 60 shown in A of FIG. 10 being 1, and the developed image 63 shown in B of FIG. 10 being 0. The map generation circuit 176 defines 3 in the pseudo defect candidate pixel map in the case of the developed image 60 shown in A of FIG. 10 being 1, and the developed image 63 shown in B of FIG. 10 being 1. Thereby, the pseudo defect candidate pixel map shown in C of FIG. 10 is generated. The generated pseudo defect candidate pixel map is output to the comparison circuit 108.

In the reference image generation step (S220), the reference image generation circuit 112 (reference image generation unit) generates a reference image of the frame region 30 corresponding to the frame image 31. Specifically, it operates as follows: The reference image generation circuit 112 inputs data (first developed pattern data) of the developed image 60 of each frame region 30, and generates a reference image by performing filter processing, using a predetermined filter function, on the developed image 60 of a design pattern which is image data of a figure. Thereby, it is possible to convert the data of the developed image 60 being design side image data whose image intensity (gray scale level) is in digital values to a reference image in accordance with image generation characteristics obtained by irradiation of the multiple primary electron beams 20. The image data for each pixel of the generated reference image is output to the comparison circuit 108.

Although, in the example described above, the reference image generation circuit 112 inputs data (first developed pattern data) of the developed image 60 for which image development was performed in the development circuit 113, and generates a reference image by performing filtering processing on the developed image 60 by using a predetermined filter function, it is not limited thereto. For example, it is also preferable that the reference image generation circuit 112 inputs design pattern data which has not been resized from the storage device 109, and, after performing image development by the same method as described above, without through the development circuit 113, generates a reference image by performing filtering processing using a predetermined filter function. Thereby, the development circuit 113 generates a developed image of binary values (two gray scales of 0 and 1), and the reference image generation circuit 112 can generate a reference image of multiple values (e.g., 256 gray scales from 0 to 255) larger than the binary values.

Alternatively, by commonly using one of the development circuits 111 and 113, data (first developed pattern data) of binary values (two gray scales of 0 and 1) or multiple values (e.g., 256 gray scales from 0 to 255) of the developed image 60, and data (second developed pattern data) of the developed image 63 may be generated. When one of the development circuits 111 and 113 generates the developed images 60 and 63 of multiple values larger than binary values, a conversion circuit (not shown) which converts, for generating a pseudo defect candidate pixel map, data of the developed images 60 and 63 of the multiple values into data (first developed pattern data) of the developed image 60 of binary values and data (second developed pattern data) of the developed image 63 of binary values may be separately disposed.

In the comparison circuit 108, data of the reference image for each frame region 30 is stored in the storage device 52. Further, a pseudo defect candidate pixel map is stored in the storage device 51.

In the comparison step (S230), using the pseudo defect candidate pixel map, the comparison circuit 108 (comparison unit) compares the frame image 31 with the reference image of the frame region 30 corresponding to the frame image 31. Specifically, it operates as follows: First, the alignment unit 57 reads the frame image 31 serving as an image to be inspected, and the reference image corresponding to the frame image 31 concerned, and provides alignment between both the images, based on units of sub-pixels smaller than pixels. For example, the alignment can be performed by a least-square method.

Then, the comparison unit 58 compares, for each pixel, the frame image 31 (secondary electron image) with the reference image. The comparison unit 58 compares them, for each pixel, based on predetermined determination conditions in order to determine whether there is a defect such as a shape defect. For example, if a difference in gray scale level of each pixel is larger than a determination threshold Th, it is determined that there is a defect. The comparison unit 58 changes an inspection threshold, depending on a value defined in the pseudo defect candidate pixel map. Specifically, when performing comparison for each pixel, the comparison unit 58, referring to the pseudo defect candidate pixel map, makes the inspection threshold in performing comparison for a pseudo defect candidate pixel looser than that in performing comparison for a pixel other than the pseudo defect candidate one. The pixel for which 2 is defined in the pseudo defect candidate pixel map is a pseudo defect candidate pixel. With respect to the determination threshold Th, when the difference in gray scale level of each pixel exceeds 15, for example, it is usually determined to be a defect. However, in the case of the pixel defined by 2, when the difference in gray scale level exceeds 30, for example, it is determined to be a defect. In other words, even when it exceeds 15, for example, it is determined not to be a defect as long as equal to or less than 30, for example. With respect to a pixel for which 3 is defined in the pseudo defect candidate pixel map, since there is a high possibility that the pixel is affected by a pseudo pattern although a figure pattern exists therein, the inspection threshold to be used is preferably looser than usual but stricter than that for a pseudo defect candidate pixel in which no figure pattern exists. Alternatively, with respect to a pixel for which 2 or 3 is defined in the pseudo defect candidate pixel map, it is also acceptable not to determine as a defect in the first place, or acceptable to skip it without performing comparison processing itself. Then, the comparison result is output. It may be output to the storage device 109, monitor 117, or memory 118, or alternatively, may be output from the printer 119.

In the examples described above, the die-to-database inspection is explained. However, it is not limited thereto. The die-to-die inspection may be performed. In the case of the die-to-die inspection, alignment and comparison having been described above are carried out between a target frame image 31 (die 1) and another frame image 31 (die 2) (another example of a reference image) in which the same pattern as that of the target frame image 31 is formed. Even in such a case, when performing comparison for a pseudo defect candidate pixel referring to the pseudo defect candidate pixel map, the inspection threshold is made to be looser than that of performing comparison for a pixel other than the pseudo defect candidate one.

According to the embodiment 1, as described above, a pseudo defect due to a line-like or band-like pseudo pattern, which does not originally exist, along and outside a figure pattern can be reduced in an electron beam inspection. Here, in inspecting a figure pattern on the wafer, as "design pattern data" being a basis of a reference image, data without (before applied with) an auxiliary pattern optically processed, such as OPC (Optical Proximity Correction) should be used. Besides, as a matter of course, dimensions of a pattern on the wafer, and dimensions in design pattern data must be in equal scale magnification (before adjusting to dimensions of photomasks).

Embodiment 2

Although the embodiment 1 describes the configuration in which pseudo defects are reduced by changing the determination threshold for a pseudo defect candidate pixel by using, without correcting, a measured pixel value of the frame image 31, an embodiment 2 describes a configuration in which the gray-scale value itself of a line-like or band-like pseudo pattern which does not exist originally is corrected.

FIG. 11 is a diagram showing a configuration of a pattern inspection apparatus according to the embodiment 2. FIG. 11 is the same as FIG. 1 except for a correction circuit 178 is added. Therefore, in the control system circuit 160, the control computer 110 which controls the whole of the inspection apparatus 100 is connected, through the bus 120, to the position circuit 107, the comparison circuit 108, the development circuits 111 and 113, the reference image generation circuit 112, the stage control circuit 114, the lens control circuit 124, the blanking control circuit 126, the deflection control circuit 128, the resize circuit 170, the extraction circuit 172, the selection circuit 174, the map generation circuit 176, the correction circuit 178, the storage device 109, the monitor 117, the memory 118, and the printer 119.

Figure 12:
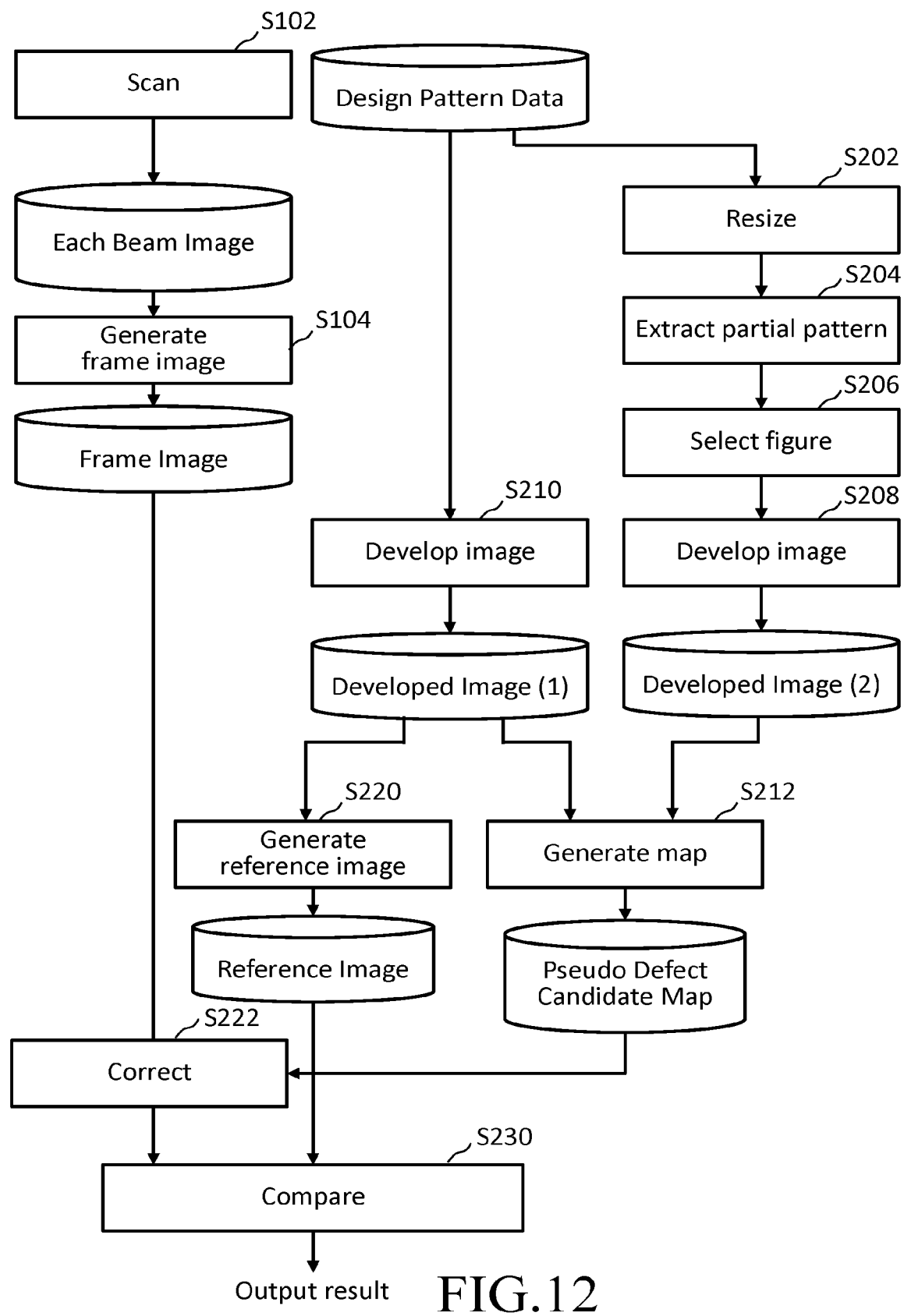
FIG. 12 is a flowchart showing main steps of an inspection method according to the embodiment 2.

FIG. 12 is a flowchart showing main steps of an inspection method according to the embodiment 2. FIG. 12 is the same as FIG. 3 except that a correction step (S222) is added between the frame image generation step (S104) and the comparison step (S230). The contents of the embodiment 2 are same as those of the embodiment 1 except for what is particularly described below.

The contents of each of the steps from the scanning step (S102) to the reference image generation step (S220) are the same as those of the embodiment 1.

Figure 13:
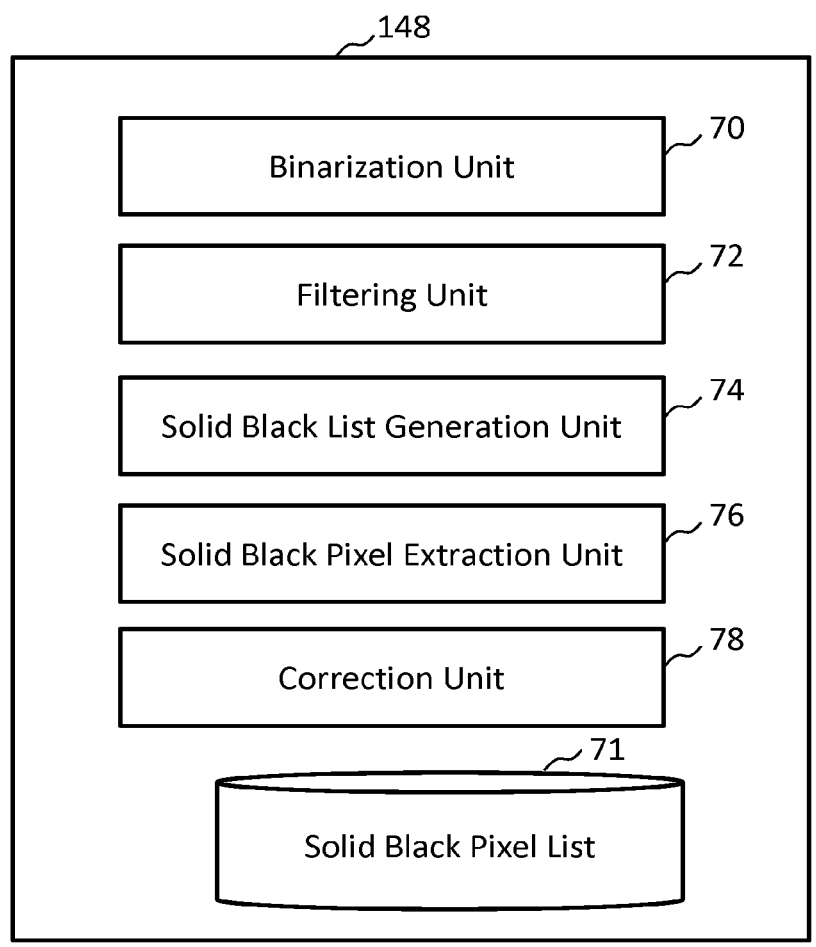
FIG. 13 is a diagram showing an internal configuration of a correction circuit according to the embodiment 2.

FIG. 13 is a diagram showing an internal configuration of a correction circuit according to the embodiment 2. In FIG. 13, in the correction circuit 178, there are disposed a binarization processing unit 70, a filter processing unit 72, a solid black list generation unit 74, a solid black pixel extraction unit 76, a correction processing unit 78, and a storage device 71 such as a magnetic disk drive. Each of the "units" such as the binarization processing unit 70, the filter processing unit 72, the solid black list generation unit 74, the solid black pixel extraction unit 76, and the correction processing unit 78 includes processing circuitry. As the processing circuitry, an electric circuit, computer, processor, circuit board, quantum circuit, semiconductor device, or the like can be used. Further, common processing circuitry (same processing circuitry), or different processing circuitry (separate processing circuitry) may be used for each of the "units". Input data required in the binarization processing unit 70, the filter processing unit 72, the solid black list generation unit 74, the solid black pixel extraction unit 76, and the correction processing unit 78, or a calculated result is stored in a memory (not shown) or in the memory 118 each time. Here, the pattern portion (convex portion to the surface of the substrate 101) except the edge is defined as solid white (high luminance region/high gray scale region). Conversely, the portion without a pattern is defined as solid black (low luminance region/low gray scale region).

Figure 14:
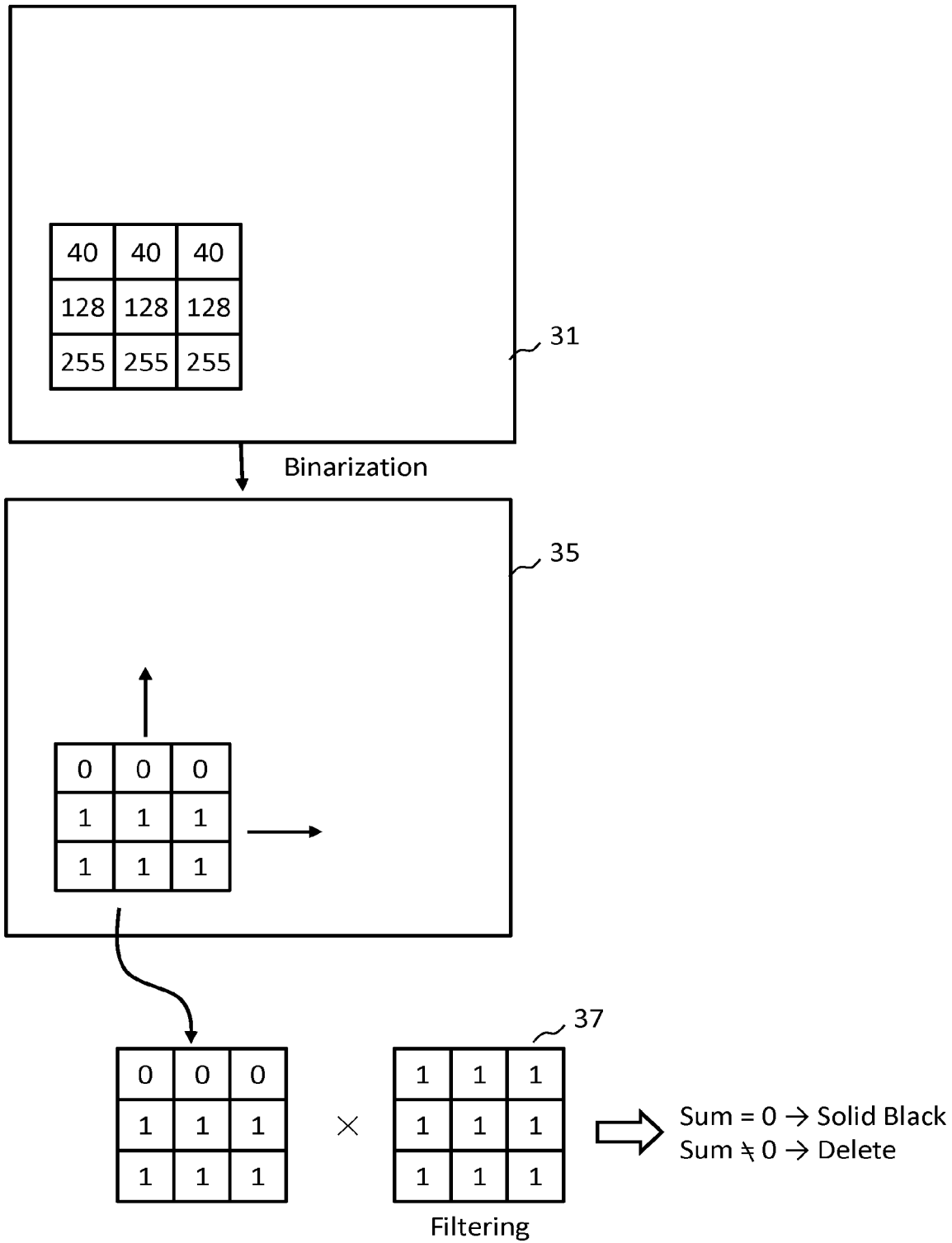
FIG. 14 is a diagram illustrating contents of a correction step according to the embodiment 2.

In the correction step (S222), first, the binarization processing unit 70 reads the frame image 31 from the storage device 56 in the comparison circuit 108, and, for each frame image 31, changes the frame image 31 of 256 gray scales to a frame image 35 of two gray scales. For example, pixels equal to or less than a gray scale threshold are defined to be 0, and those more than the threshold are defined to be 1. If the frame image 31 is measured as an image of binary values from the first, binarization processing is unnecessary FIG. 14 is a diagram illustrating a correction step according to the embodiment 2. In FIG. 14, in the gray-scale values of 0 to 255, for example, pixels of solid black portions and margins, whose each gray-scale value is equal to or less than 45, for example, are defined as 0. For example, the pixel whose gray-scale value is larger than 45 is defined as 1. A normal value of the gray-scale value equivalent to a solid black portion can be obtained based on experiments or rules of thumb in advance.

The filter processing unit 72 performs filtering processing on the frame image 35 of binary values by using a filter function 37. In the case of FIG. 14, the filter function 37 of a matrix of 3×3 each defined by 1 is used, for example. Then, while moving a target pixel in order in, for example, 512×512 pixel frame image 35 of binary values, pixels centering on the target pixel are multiplied by the filter function 37 of 3×3. Pixels whose sum is zero are solid black pixels in a solid black (low luminance) region where no figure pattern is included in the pixels. In other words, pixels whose sum is zero are solid black pixels in a low luminance region not affected by a figure pattern or/and a pseudo pattern. On the other hand, pixels whose sum is not zero are pixels in a region affected by a figure pattern or/and a pseudo pattern.

The solid black list generation unit 74 generates, for each frame image 31, a solid black list in which positions of solid black pixels whose sum is zero after filter processing, and gray-scale values before binarization processing are defined. The generated solid black list is stored in the storage device 71.

The solid black pixel extraction unit 76 (extraction unit) extracts, for each frame image 31, a pixel (solid black pixel) of a region with no pattern in the frame image 31. Specifically, referring to a pseudo defect candidate pixel map, the solid black pixel extraction unit 76 extracts a solid black pixel located close to a target pseudo defect candidate pixel in the solid black list while moving the target pseudo defect candidate pixel in order. Here, one solid black pixel closest to the target pseudo defect candidate pixel is extracted, for example. Alternatively, a plurality of solid black pixels in the order of distance from the closest one may be extracted.

The correction processing unit 78 (correction unit) corrects, for each frame image 31, the gray-scale value of a pseudo defect candidate pixel by substituting a value determined based on the gray-scale value of a pixel (solid black pixel) in a region with no pattern for the gray-scale value of a pseudo defect candidate pixel in the frame image 31.

Figure 15:
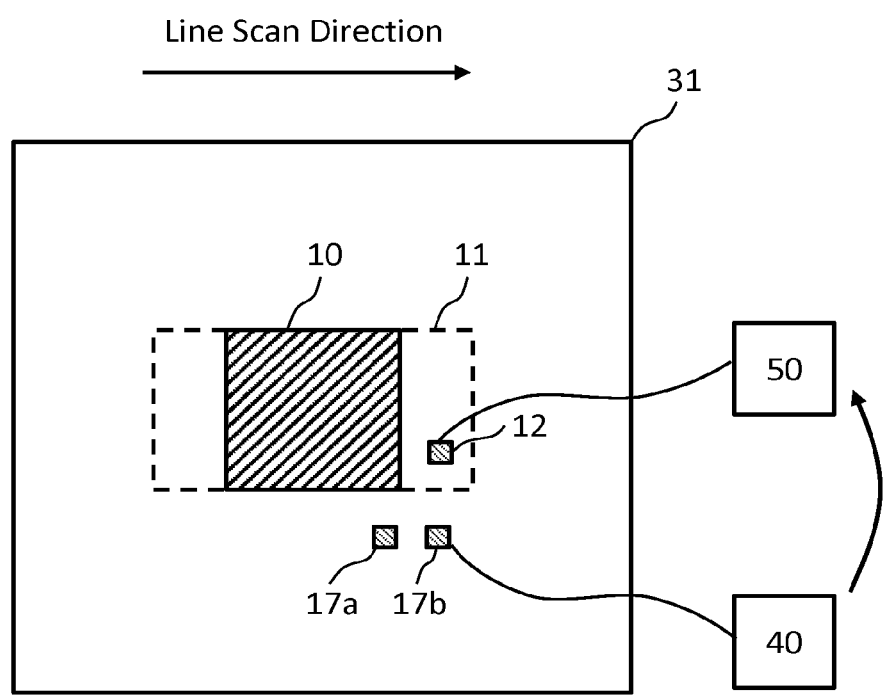
FIG. 15 is a diagram illustrating a method of correcting a pseudo defect candidate pixel according to the embodiment 2.

FIG. 15 is a diagram illustrating a method of correcting a pseudo defect candidate pixel according to the embodiment 2. FIG. 15 shows the case where the pseudo pattern 11 is generated along the line scan direction from the end of the figure pattern 10 in the frame image 31. The generation region of the pseudo pattern 11 is composed of a plurality of pseudo defect candidate pixels. In the example of FIG. 15, there are shown two solid black pixels 17a and 17b located close to a target pseudo defect candidate pixel 12 in a plurality of pseudo defect candidate pixels. Although the two solid black pixels 17a and 17b are shown as representatives, it goes without saying that more solid black pixels exist in the example of FIG. 15. The correction processing unit 78 replaces the gray-scale value of the pseudo defect candidate pixel by a value determined based on the gray-scale value of at least one pixel located close to the pseudo defect candidate pixel in a plurality of extracted solid black pixels. The gray-scale value of the closest solid black pixel, for example, is substituted for the gray-scale value of the target pseudo defect candidate pixel. In the case of FIG. 15, if the gray-scale value of the target pseudo defect candidate pixel 12 is 50, 50 is replaced by, for example, 40 being the gray-scale value of the solid black pixel 17b which is the closer of the two solid black pixels 17a and 17b. Alternatively, if a plurality of solid black pixels are extracted, it is also preferable that the correction processing unit 78 replaces the gray-scale value of the pseudo defect candidate pixel 12 by an average of the gray-scale values of the plurality of extracted solid black pixels. Instead of the average, other statistics such as the minimum, the maximum, or the median may be used. The frame image 31 in which the gray-scale value of the pseudo defect candidate pixel has been corrected is output to the comparison circuit 108.

In the comparison step (S230), the comparison circuit 108 (comparison unit) compares the frame image 31 in which the gray-scale value of the pseudo defect candidate pixel has been corrected with the reference image of the frame region 30 corresponding to the frame image 31. It is here not necessary to refer to the pseudo defect candidate pixel map, comparison processing can be executed using the usual inspection threshold. The contents of the comparison step (S230) are the same as those of the embodiment 1.

In the examples described above, the die-to-database inspection is described. However, it is not limited thereto. A die-to-die inspection may be performed. In the case of the die-to-die inspection, alignment and comparison having been described above are carried out between the frame image 31 (die 1) to be inspected and another frame image 31 (die 2) (another example of a reference image) in which the same pattern as that of the frame image 31 to be inspected is formed.

As described above, according to the embodiment 2, a line-like or band-like pseudo pattern which does not exist originally can be deleted by replacing the gray-scale value of a pixel at the position where the line-like or band-like pseudo pattern which does not exist originally is generated by the gray-scale value of a pixel at the position where a figure pattern and a pseudo pattern are not generated. Therefore, similarly to the embodiment 1, it is possible in the electron beam inspection to reduce a pseudo defect due to a line-like or band-like pseudo pattern, which does not originally exist, along and outside a figure pattern.

In the above description, a series of "... circuits" includes processing circuitry, which includes an electric circuit, a computer, a processor, a circuit board, a quantum circuit, a semiconductor device, or the like. Each "... circuit" may use common processing circuitry (the same processing circuitry), or different processing circuitry (separate processing circuitry). A program for causing a processor, etc. to execute processing may be stored in a recording medium, such as a magnetic disk drive, magnetic tape drive, FD, ROM (Read Only Memory) or the like. For example, the position circuit 107, the comparison circuit 108, the development circuits 111 and 113, the reference image generation circuit 112, the stage control circuit 114, the lens control circuit 124, the blanking control circuit 126, the deflection control circuit 128, the resize circuit 170, the extraction circuit 172, the selection circuit 174, the map generation circuit 176 and the correction circuit 178 may be configured by at least one processing circuit described above. For example, processing in these circuits may be carried out by the control computer 110.

Embodiments have been explained referring to specific examples as described above. However, the present invention is not limited to these specific examples. Although FIG. 1 shows the case where the multiple primary electron beams 20 are formed by the shaping aperture array substrate 203 irradiated with one beam from the electron gun 201 serving as an irradiation source, it is not limited thereto. The multiple primary electron beams 20 may be formed by irradiation with a primary electron beam from each of a plurality of irradiation sources. Further, as one of functions of the development processing in the examples described above, it is also preferable, if necessary, to invert light and dark of the gray-scale value of a developed image. When gray-scale value data of a pixel is defined by, for example, 8 bits, light and dark of a gray-scale value can be inverted by ("output pixel gray-scale value=255"−"input pixel gray-scale value"). When inverting light and dark of a gray-scale value, in the case of performing filter processing on the frame image 35 of binary values by using the filter function 37 in the embodiment 2, pixels whose sum is 9 are solid white pixels in a solid white (high gray scale value) region where no figure pattern is included in the pixels. In other words, pixels whose sum is 9 are solid white pixels in a high gray scale value region not affected by a figure pattern or/and a pseudo pattern. On the other hand, pixels whose sum is not 9 are pixels in a region affected by a figure pattern or/and a pseudo pattern. Therefore, when light and dark of a gray-scale value of a developed image is inverted, solid white pixels whose sum is 9 of a solid white (high gray scale value) region are extracted.

While the apparatus configuration, control method, and the like not directly necessary for explaining the present invention are not described, some or all of them can be appropriately selected and used on a case-by-case basis when needed.

Further, any other electron beam inspection apparatus and electron beam inspection method that include elements of the present invention and that can be appropriately modified by those skilled in the art are included within the scope of the present invention.

INDUSTRIAL APPLICABILITY

The present invention relates to an electron beam inspection apparatus and an electron beam inspection method, which can be applied to an inspection apparatus and its method using multiple electron beams, for example.

REFERENCE SIGNS LIST

10 Figure pattern
11 Pseudo pattern
13, 14 Rectangular pattern
20 Multiple primary electron beams
21 Primary electron beam
22 Hole
29 Sub-irradiation region
30 Frame region
31, 35 Frame image
32 Stripe region
33 Rectangular region
34 Irradiation region
37 Filter function
40, 42 Figure pattern
43 Partial pattern
50, 51, 52, 56 Storage device
54 Frame image generation unit
57 Alignment unit
58 Comparison unit
60, 63 Developed image
70 Binarization processing unit
71 Storage device
72 Filter processing unit
74 Solid black list generation unit
76 Solid black pixel extraction unit
78 Correction processing unit
100 Inspection apparatus
101 Substrate
102 Electron beam column
103 Inspection chamber
105 Stage
106 Detection circuit
107 Position circuit
108 Comparison circuit
109 Storage device
110 Control computer
111,113 Development circuit
112 Reference image generation circuit
114 Stage control circuit
117 Monitor 118 Memory
119 Printer
120 Bus
122 Laser length measuring system
123 Chip pattern memory
124 Lens control circuit
126 Blanking control circuit
128 Deflection control circuit
142 Drive mechanism
144, 146, 148 DAC amplifier
150 Image acquisition mechanism
160 Control system circuit
170 Resize circuit
172 Extraction circuit
174 Selection circuit
176 Map generation circuit
178 Correction circuit
201 Electron gun
202 Electromagnetic lens
203 Shaping aperture array substrate
205, 206, 207, 224, 226 Electromagnetic lens
208 Main deflector
209 Sub deflector
212 Bundle blanking deflector
213 Limiting aperture substrate
214 Beam Separator
216 Mirror
218 Deflector
219 Beam selection aperture substrate
222 Multi-detector
300 Multiple secondary electron beams
330 Inspection region
332 Chip

The invention claimed is:

1. An electron beam inspection apparatus comprising:
an image acquisition mechanism configured to acquire a secondary electron image by scanning a substrate, on which a figure pattern is formed, with an electron beam, and detecting a secondary electron emitted due to irradiation with the electron beam by the scanning;
a resize processing unit configured to perform, using design pattern data being a basis of the figure pattern, resize processing on the figure pattern to enlarge its size in a scan direction of the electron beam;
a first developed image generation unit configured to generate, using the design pattern data which has not been resized, a first developed image by developing an image of a design pattern of a region corresponding to the secondary electron image;
a second developed image generation unit configured to generate, using partial patterns enlarged by the resize processing in the figure pattern having been resized, a second developed image by developing an image of partial patterns in a region corresponding to the secondary electron image;
a map generation unit configured to generate a pseudo defect candidate pixel map which can identify a pseudo defect candidate pixel that has no pattern in the first developed image and has a pattern in the second developed image;
a reference image generation unit configured to generate a reference image of the region corresponding to the second electron image; and
a comparison unit configured to compare, using the pseudo defect candidate pixel map, the second electron image with the reference image of the region corresponding to the second electron image.

2. The electron beam inspection apparatus according to claim 1, wherein the comparison unit makes an inspection threshold in performing comparison for the pseudo defect candidate pixel looser than that in performing comparison for a pixel other than the pseudo defect candidate pixel.

3. The electron beam inspection apparatus according to claim 1, further comprising:
a selection unit configured to select a rectangular partial pattern from the partial patterns enlarged by the resize processing.

4. The electron beam inspection apparatus according to claim 1, further comprising:
an extraction unit configured to extract, for each the figure pattern having been resized, the partial patterns enlarged by the resize processing in the figure pattern having been resized.

5. The electron beam inspection apparatus according to claim 1, wherein the comparison unit changes an inspection threshold, depending on a value defined in the pseudo defect candidate pixel map.

6. An electron beam inspection apparatus comprising:
an image acquisition mechanism configured to acquire a secondary electron image by scanning a substrate, on which a figure pattern is formed, with an electron beam, and detecting a secondary electron emitted due to irradiation with the electron beam by the scanning;
a resize processing unit configured to perform, using design pattern data being a basis of the figure pattern, resize processing on the figure pattern to enlarge its size in a scan direction of the electron beam;
a first developed image generation unit configured to generate, using the design pattern data which has not been resized, a first developed image by developing an image of a design pattern of a region corresponding to the secondary electron image;
a second developed image generation unit configured to generate, using partial patterns enlarged by the resize processing in the figure pattern having been resized, a second developed image by developing an image of partial patterns in a region corresponding to the secondary electron image;
a map generation unit configured to generate a pseudo defect candidate pixel map which can identify a pseudo defect candidate pixel that has no pattern in the first developed image and has a pattern in the second developed image;
an extraction unit configured to extract a pixel in a region with no pattern in the secondary electron image;
a correction unit configured to correct a gray-scale value of the pseudo defect candidate pixel by replacing the gray-scale value of the pseudo defect candidate pixel in the secondary electron image by a value determined based on a gray-scale value of a pixel in a region with no pattern;
a reference image generation unit configured to generate a reference image of the region corresponding to the secondary electron image; and
a comparison unit configured to compare the secondary electron image in which the gray-scale value of the pseudo defect candidate pixel has been corrected with the reference image of the region corresponding to the secondary electron image.

7. The electron beam inspection apparatus according to claim 6, wherein
the extraction unit extracts a plurality of pixels as pixels in the region with no pattern, and the correction unit replaces the gray-scale value of the pseudo defect candidate pixel by a value determined based on a gray-scale value of at least one pixel located close to the pseudo defect candidate pixel in the plurality of pixels extracted.

8. An electron beam inspection method comprising:

acquiring a secondary electron image by scanning a substrate, on which a figure pattern is formed, with an electron beam, and detecting a secondary electron emitted due to irradiation with the electron beam by the scanning;

resizing, using design pattern data being a basis of the figure pattern, the figure pattern to enlarge its size in a scan direction of the electron beam;

generating, using the design pattern data which has not been resized, a first developed image by developing an image of a design pattern of a region corresponding to the secondary electron image;

generating, using partial patterns enlarged by the resizing in the figure pattern having been resized, a second developed image by developing an image of partial patterns in a region corresponding to the secondary electron image;

generating a pseudo defect candidate pixel map which can identify a pseudo defect candidate pixel that has no pattern in the first developed image and has a pattern in the second developed image;

generating a reference image of the region corresponding to the second electron image; and comparing, using the pseudo defect candidate pixel map, the second electron image with the reference image of the region corresponding to the second electron image, and outputting a result.

9. The electron beam inspection method according to claim 8, wherein an inspection threshold in performing comparison for the pseudo defect candidate pixel is made to be looser than that in performing comparison for a pixel other than the pseudo defect candidate pixel.

10. The electron beam inspection method according to claim 8, further comprising:

selecting a rectangular partial pattern from the partial patterns enlarged by the resizing.

* * * * *